(12) United States Patent
Kim et al.

(10) Patent No.: US 9,190,594 B2
(45) Date of Patent: Nov. 17, 2015

(54) THERMOELECTRIC MATERIAL HAVING REDUCED THERMAL CONDUCTIVITY, AND THERMOELECTRIC DEVICE AND MODULE INCLUDING THE SAME

(71) Applicant: Samsung Electronics Co., Ltd., Suwon-si, Gyeonggi-do (KR)

(72) Inventors: Sang-il Kim, Seoul (KR); Kyu-hyoung Lee, Hwaseong-si (KR); Sung-woo Hwang, Yongin-si (KR); Kyung-han Ahn, Uijeongbu-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 203 days.

(21) Appl. No.: 13/871,246

(22) Filed: Apr. 26, 2013

(65) Prior Publication Data

US 2013/0284967 A1 Oct. 31, 2013

(30) Foreign Application Priority Data

Apr. 27, 2012 (KR) .......................... 10-2012-044666

(51) Int. Cl.
*H01L 35/34* (2006.01)
*H01L 35/18* (2006.01)
*H01L 35/16* (2006.01)
*C01B 19/00* (2006.01)

(52) U.S. Cl.
CPC .............. *H01L 35/18* (2013.01); *C01B 19/002* (2013.01); *C01B 19/007* (2013.01); *H01L 35/16* (2013.01); *C01P 2002/00* (2013.01); *C01P 2002/01* (2013.01); *C01P 2006/40* (2013.01)

(58) Field of Classification Search
CPC .... H01L 35/16; C01B 19/007; C01P 2002/00
USPC .............................. 252/62.3 T; 423/508, 509
See application file for complete search history.

(56) References Cited

U.S. PATENT DOCUMENTS

| | | | |
|---|---|---|---|
| 2006/0102224 A1 | 5/2006 | Chen et al. | |
| 2006/0243314 A1* | 11/2006 | Ota et al. ...................... | 136/200 |
| 2008/0087314 A1 | 4/2008 | Xiao et al. | |
| 2008/0202575 A1 | 8/2008 | Ren et al. | |
| 2010/0108115 A1 | 5/2010 | Lee et al. | |
| 2011/0042607 A1 | 2/2011 | Kanatzidis et al. | |
| 2011/0073797 A1 | 3/2011 | Kanatzidis et al. | |
| 2011/0139208 A1 | 6/2011 | Lee et al. | |
| 2011/0248210 A1 | 10/2011 | Willigan et al. | |

FOREIGN PATENT DOCUMENTS

| | | |
|---|---|---|
| JP | 2002-026403 A | 1/2002 |
| JP | 2002-026404 A | 1/2002 |
| JP | 2002-026405 A | 1/2002 |
| JP | 2007-088239 A | 4/2007 |
| JP | 2008-305907 A | 12/2008 |
| JP | 2011-134989 A | 7/2011 |
| WO | 2011051771 A1 | 5/2011 |

OTHER PUBLICATIONS

Bed Poudel et al., "High-Thermoelectric Performance of Nanostructured Bismuth Antimony Telluride Bulk Alloys", Science, vol. 320, May 2, 2008, pp. 634-638.
Shufen Fan et al., "p-type Bi0.4Sb1.6Te3 nanocomposites with enhanced figure of merit", Applied Physics Letters 96, 2010, pp. 182104-1-182104-3.
Wenjie Xie et al., "Unique nanostructures and enhanced thermoelectric performance of melt-spun BiSbTe alloys", Applied Physics Letters 94, 2009, pp. 102111-1-102111-3.
Fan et al., "Influence of nanoinclusions on Thermoelectric Properties of n-Type Bi2Te3 Nanocomposites", Journal of Electronic Materials, vol. 40, No. 5, 2011, pp. 1018-1023.
Ivanova et al., "Thermoelectric and Mechanical Properties of the Bi0.5Sb1.5Te3 Solid Solution Prepared by Melt Spinning", Inorganic Materials, vol. 49, No. 2, 2013, pp. 120-126.
Kim et al., "Enhancement of Seebeck coefficient in Bi0.5Sb1.5Te3 with High-Density Tellurium Nanoinclusions", Applied Physics Express, vol. 4, No. 9, Sep. 1, 2011, pp. 191801-1-191801-3.
The Extended European Search Report for European Patent Application No. 13165640.7 dated Sep. 15, 2014.
Xie et al., "Identifying the Specific Nanostructures Responsible for the High Thermoelectric Performance of (Bi, Sb) 2Te3 nanocomposites", Nano Lett., vol. 10, No. 9, Sep. 8, 2010, pp. 3283-3289.
Xie et al., "Nanostructure and thermoelectric properties of p-type Bi0.5Sb1.5Te3 compound prepared by melt spinning technique", International conference on Thermoelectrics, Jun. 3, 2007, pp. 23-27.
Zhang et al., "In Situ Precipitation of Te Nanoparticles in P-Type BiSbTe and the Effect on Thermoelectric Performance", ACS Applied Materials & Interfaces, vol. 5, No. 8, Apr. 24, 2013, pp. 3071-3074.
Venkatasubramanian et al., "Thin-Film thermoelectric devices with high room-temperature figures of merit", Nature, vol. 413, Oct. 11, 2001, pp. 597-602.

* cited by examiner

Primary Examiner — Carol M Koslow
(74) Attorney, Agent, or Firm — Cantor Colburn LLP

(57) ABSTRACT

A thermoelectric material including: a thermoelectric matrix including grains with a composition of Formula 1:

$(Bi_xSb_{1-x})_a(Te_ySe_{1-y})_b$      Formula 1 wherein $1.8 \leq a \leq 2.2$, $2.8 \leq b \leq 3.2$, $0 \leq x \leq 1$, and $0 \leq y \leq 1$, and wherein a plurality of dislocations is present along a grain boundary between adjacent grains of the composition of Formula 1.

22 Claims, 29 Drawing Sheets

THERMOELECTRIC MATERIAL HAVING REDUCED THERMAL CONDUCTIVITY, AND THERMOELECTRIC DEVICE AND MODULE INCLUDING THE SAME

CROSS-REFERENCE TO RELATED APPLICATIONS

This application claims priority to and the benefit of Korean Patent Application No. 10-2012-0044666, filed on Apr. 27, 2012, and all the benefits accruing therefrom under 35 U.S.C. §119, the content of which is incorporated herein in its entirety by reference.

BACKGROUND

1. Field

The present disclosure relates to a high efficiency thermoelectric material, and a thermoelectric device and thermoelectric module including the same.

2. Description of the Related Art

In general, the thermoelectric effect, which directly converts a temperature difference into electricity and vice-versa, is a key technology for renewable energy harvesting and solid-state refrigeration. It is a phenomenon occurring as a result of phonon transfer due to the movement of electrons and holes inside a material. The thermoelectric effect includes the Peltier effect, which utilizes a temperature gradient established across opposite ends of a material by current applied from outside to provide cooling, and the Seebeck effect, which utilizes electromotive force generated by a temperature gradient at opposite ends of a material for power generation.

Thermoelectric energy conversion technology offers an energy generation technology to harvest waste heat from many industries, as well as a next-generation solid-state cooling technology to replace inefficient vapor-compression cycle technologies.

Thermoelectric cooling using a thermoelectric material is an environmentally-friendly cooling technology with zero vibration and low noise, and is achieved without using a refrigerant gas, which can be harmful to the environment. In addition, the improvement in cooling efficiency provided by high efficiency thermoelectric cooling may be expanded to residential or commercial cooling applications, such as with refrigerators, air conditioners, and the like. Further, the use of a thermoelectric generation material in a heat sink in vehicle engines, or industrial plants would enable the generation of electrical power from a temperature gradient occurring across opposite ends of the thermoelectric material, and thus would be applicable as a renewable energy source.

Thus it would be desirable to have a more efficient thermoelectric material suitable for use at ambient temperatures.

SUMMARY

Provided is a thermoelectric material with improved thermoelectric performance achieved by considerably reducing its thermal conductivity.

Provided also is a thermoelectric device including the above thermoelectric material.

Provided further is a thermoelectric module including the thermoelectric device.

In an aspect, there is provided a thermoelectric material including a thermoelectric matrix including grains with a composition of Formula 1, $$(Bi_xSb_{1-x})_a(Te_ySe_{1-y})_b \qquad \text{Formula 1}$$

wherein $1.8 \leq a \leq 2.2$, $2.8 \leq b \leq 3.2$, $0 \leq x \leq 1$, and $0 \leq y \leq 1$, and wherein a plurality of dislocations is present along a grain boundary between adjacent grains of the composition of Formula 1.

Also disclosed is a thermoelectric material including: a thermoelectric matrix including grains having a composition of Formula 1:

$$(Bi_xSb_{1-x})_a(Te_ySe_{1-y})_b \qquad \text{Formula 1}$$

wherein $1.8 \leq a \leq 2.2$, $2.8 \leq b \leq 3.2$, $0 \leq x \leq 1$, and $0 \leq y \leq 1$; and an additive, wherein a semi-coherent interface is present between a grain of the composition of Formula 1 and the additive.

In another aspect, there is provided a method for manufacturing thermoelectric material including:

heating a precursor material including a flux and a composition of Formula 1 below to obtain a melt;

$$(Bi_xSb_{1-x})_a(Te_ySe_{1-y})_b \qquad \text{Formula 1}$$

wherein, $1.8 \leq a \leq 2.2$, $2.8 \leq b \leq 3.2$, $0 \leq x \leq 1$, and $0 \leq y \leq 1$; rapidly solidifying the melt to form a solidified intermediate; pressure-sintering the solidified intermediate to obtain the thermoelectric material, wherein the thermoelectric material has a plurality of dislocations present along a grain boundary between adjacent grains of the composition of Formula 1. During the pressure-sintering of the solidified intermediate, the flux is removed.

In a further aspect, there is provided a method for manufacturing a thermoelectric material including:

heating a precursor material including an additive and a composition of Formula 1 to obtain a melt $$(Bi_xSb_{1-x})_a(Te_ySe_{1-y})_b \qquad \text{Formula 1}$$

wherein, $1.8 \leq a \leq 2.2$, $2.8 \leq b \leq 3.2$, $0 \leq x \leq 1$, and $0 \leq y \leq 1$; rapidly solidifying the melt to form a solidified intermediate; and pressure-sintering the solidified intermediate to form a thermoelectric matrix including grains with a composition of Formula 1 obtain the thermoelectric material, wherein the thermoelectric material has a semi-coherent interface between a grain of the composition of Formula 1 and the additive.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
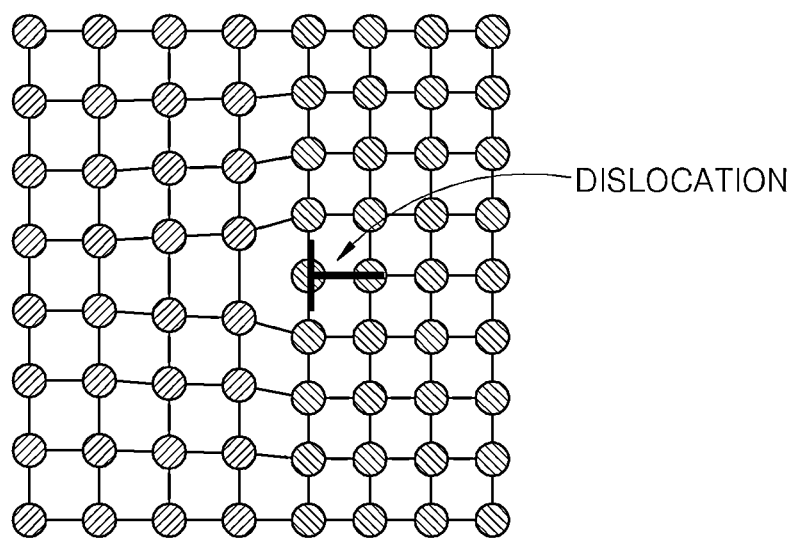
FIG. 1 is a diagram illustrating an embodiment of a dislocation occurring at an embodiment of an interface of a lattice.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. "Or" means "and/or."

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Transition metal" as defined herein refers to an element of Groups 3 to 12 of the Periodic Table of the Elements.

To use low-temperature waste heat, a thermoelectric ("TE") material that is effective at around room temperature would be desirable. $(Bi,Sb)_2(Te,Se)_3$-based materials are usable at around room temperature. However, for $(Bi,Sb)_2(Te,Se)_3$-based materials, which are the most dominantly used TE materials near room temperature, the thermoelectric figure of merit, which represents the properties of a thermoelectric material, has remained at the level of about 1.0 for the past 50 years. Since the efficiency of TE technology is directly related to the energy conversion performance of such materials, much research has been focused on the development of more efficient materials because improvement in the properties of $(Bi,Sb)_2(Te,Se)_3$-based thermoelectric materials would considerably expand their field of application.

In an aspect, there is provided a thermoelectric material including a thermoelectric matrix comprising grains of a $(Bi,Sb)_2(Te,Se)_3$-based composition, wherein a grain boundary comprises a dislocation. The dislocation may be formed spontaneously during a densification process. In an embodiment and while not wanting to be bound by theory, it is understood that an additive, e.g., an excess of Te in a $(Bi,Sb)_2(Te,Se)_3$-based composition, can facilitate grain rearrangement to accommodate mismatches of similar lattices of adjacent grains of the thermoelectric matrix, and/or mismatches of the lattices of the thermoelectric matrix and the additive, e.g., the $(Bi,Sb)_2(Te,Se)_3$-based composition and Te.

While not wanting to be bound by theory, it is understood that grain rearrangement occurs during sintering to lower grain boundary energy. The grain rearrangements may result in a high density of dislocations being formed at a grain boundary. The dislocation is formed due to the mismatch of the similar lattices of the $(Bi,Sb)_2(Te,Se)_3$-based composition and the additive. The high density of dislocations is understood to reduce the thermal conductivity of the thermoelectric material, improving thermoelectric performance.

The performance of a thermoelectric material can be calculated by Equation 1 below, to provide the dimensionless figure of merit ZT, $$ZT=(S^2\sigma T)/\kappa \qquad \text{Equation 1}$$

wherein S is Seebeck coefficient, $\sigma$ is electrical conductivity, T is absolute temperature, and $\kappa$ is thermal conductivity.

As shown in the Equation 1, in order to increase the ZT value of a thermoelectric material, the Seebeck coefficient and the electrical conductivity, i.e., its power factor ($S^2\sigma$), should be increased while decreasing its thermal conductivity. However, Seebeck coefficient and thermal conductivity have a trade-off relationship in that when there is an increase in one, the other decreases according to the concentration of an electron or a hole as a carrier, thus greatly limiting the increase in the power factor.

With the rapid growth in nanostructure technology during the late 1990s, it has been made possible to manufacture super-lattice thin films, nanowires, and quantum dots, and superior thermoelectric performance of these materials has been achieved by increasing the Seebeck coefficient by quantum confinement effects or by decreasing thermal conductivity by methods based on the concept of phonon glass electron crystal ("PGEC") behavior.

The quantum confinement effect can be used to increase the Seebeck coefficient by increasing the density of states of carriers in the material, thereby enlarging the effective mass of the carriers while preventing their thermal conductivity from being significantly changed, thereby destroying the trade-off between thermal conductivity and Seebeck coefficient).

The PGEC concept provides for selectively reducing the thermal conductivity of carriers by blocking the movement of phonons which are involved in heat transfer without preventing the movement of carriers.

In an embodiment, the thermoelectric material is prepared based on the PGEC concept, where the movement of phonons is blocked by the regular dislocations formed at a semi-coherent interface without substantially preventing the transport of carriers, thereby lowering thermal conductivity and improving thermoelectric performance. The size of the strain field of the high density dislocation is in the range of about 1 nanometer (nm) to about 50 nm, and it may be an effective lattice defect to reduce thermal conductivity of the $(Bi,Sb)_2(Te,Se)_3$-based thermoelectric matrix.

The dislocation may be a misfit dislocation, as shown in FIG. 1. While not wanting to be bound by theory, it is understood that the dislocation is formed when two different lattices with similar lattice constants are in close contact to form an interface. Strain and stress result because of the differences in the lattice constants of the dissimilar materials. An interface including the dislocation is called a semi-coherent interface. It is understood that the semi-coherent interface forms due to the similarity of the lattice surfaces.

While not wanting to be bound by theory, the generation of dislocations at the grain boundary can be explained using a coincident site lattice ("CSL") model or a structural-unit model. Adjacent grains may rearrange to lower grain boundary energy during sintering, and the grain rearrangement may be facilitated by a transient liquid, e.g., a liquid form of an additive or flux, such as transient liquid tellurium present during the sintering. For some discrete misorientations between crystals, a coincident site lattice, which is common to the two adjacent grains, may be defined. The deviation from the exact coincidence site (Near-CSL) lattice misorientation is understood to result in a high-density of dislocations at the boundary. In other words, periodic misfit dislocations may be formed due to d-spacing (i.e., interplanar spacing) mismatch of adjacent grains. This can lower grain boundary energy and result in the formation of dislocations. In an embodiment, excess Te is used during the sintering process to cause grain rearrangement to lower grain boundary energy. The spacing between dislocations can be calculated by the difference in the lattice constant between the two different materials or the difference in an interplanar distance of each crystal face of two different lattices.

Depending on the type of material, a semi-coherent interface may be formed when the difference in the lattice constants between the two different lattices having similar lattice structures or the difference in the interplanar distance (i.e., interplanar spacing) between the crystal faces of two different lattices is from about 1 percent (%) to about 20%, specifically about 2% to about 18%, more specifically about 7% to about 15%. The semi-coherent interface may be formed between different materials, and it may be formed between crystal faces of a same material where the mismatch in lattice constants between the crystal faces of grains of the thermoelectric matrix is about 0.1% to about 20%, specifically about 0.5% to about 3%, more specifically about 3% or less.

$(Bi,Sb)_2(Te,Se)_3$-based lattices have a complex atomic configuration and have a plurality of crystal faces, and a semi-coherent interface may be between crystal faces having sufficient similarity between the interplanar distances of the crystal faces. When a difference between the interplanar distances of the crystal faces in the two different lattices exceeds a predetermined range, an incoherent interface is formed, and neither strain nor stress is accompanied therein.

In an aspect, a semi-coherent interface may be formed in the grain boundary between adjacent grains of the thermoelectric matrix, in which the grains have a composition of Formula 1,

   Formula 1 wherein 1.8≤a≤2.2, 2.8≤b≤3.2, 0≤x≤1, and 0≤y≤1.

In another embodiment, a thermoelectric material comprises: a thermoelectric matrix comprising a grain having the composition of Formula 1, wherein, 1.8≤a≤2.2, 2.8≤b≤3.2, 0≤x≤1, and 0≤y≤1; and wherein a plurality of dislocations is present along a grain boundary between adjacent grains of the composition of Formula 1.

In another aspect, a thermoelectric material comprises a thermoelectric matrix comprising grains having the composition of Formula 1, wherein, 1.8≤a≤2.2, 2.8≤b≤3.2, 0≤x≤1, and 0≤y≤1; and an additive, wherein a semi-coherent interface is present between the grain of the composition of Formula 1 and the additive. The additive may be disposed between adjacent grains of the composition of Formula 1, and thus the semi-coherent interface may be disposed between adjacent grains of the composition of Formula 1.

The semi-coherent interface may comprise a plurality of dislocations. The dislocations may be misfit dislocations. The plurality of dislocations may be disposed in the form of an array. In an embodiment, the disclocations of the array are spaced at an interval of about 1 nanometer (nm) to about 100 nm, specifically about 2 nm to about 80 nm, more specifically about 4 nm to about 60 nm.

The thermoelectric material may have a lattice thermal conductivity of 0.4 Watts per meter-Kelvin (W/mK) or less, specifically about 0.35 W/mK or less, more specifically about 0.35 W/mK to about 0.1 W/mK, at room temperature, for example, about 300 K.

In an embodiment a crystal structure of the additive and a crystal structure of the composition of Formula 1 belong to a same crystal family. For example, the crystal structure of the composition of Formula 1 may have rhombohedral symmetry and the additive may have a crystal structure having hexagonal symmetry.

The lattice structure of grains with the composition of the Formula 1 may be a rhombohedral structure wherein a is about 4.3 angstroms (Å), and c is about 30.45 Å, and a semi-coherent interface may be formed on the grain boundary in the thermoelectric matrix, and dislocations may be regularly formed along the boundary. For example, the dislocations may be formed along the semi-coherent interface at intervals of about 1 nm to about 100 nm, or about 2 nm to about 20 nm.

Examples of the thermoelectric matrix forming the semi-coherent interface include nano-structured grains having the composition of the Formula 1.

The semi-coherent interface may be formed between adjacent grains in the thermoelectric matrix, and the grain boundary may have a matching lattice structure.

The thermoelectric material may further include an additive, e.g., a metal additive, (e.g., an inclusion) having a lattice structure which matches that of the thermoelectric matrix. As used herein, matching lattice structures have a symmetry in a same crystal family, and lattice constants within about 15% or less, specifically within about 7%, more specifically within about 1% to about 3%.

The metal additive may form a semi-coherent interface with the composition of Formula 1. In an embodiment wherein the composition of Formula 1 has a rhombohedral structure, the metal additive has a structure similar to that of the rhombohedral lattice structure, e.g., a hexagonal structure. In the rhombohedral structure of the composition of Formula 1, a may be about 4.3 Å, and c may be about 30.45 Å, for example. In the semi-coherent interface where the grains and the metal additive are in contact, regular high density dislocations may be formed due to the lattice matching and thus a thermal conductivity of the thermoelectric material may be reduced.

In the semi-coherent interface, as described above, the difference in the lattice constant between the grains in the thermoelectric matrix, e.g., of the composition of Formula 1, and the metal additive is about 7% or less, for example, a difference of about 2% to about 4% may be present.

The metal additive may be dispersed in the thermoelectric matrix in the form of an inclusion, and may form a semi-coherent interface when contacted with a nano-structured grain of the composition of Formula 1, which constitutes the thermoelectric matrix.

The metal additive, which forms a semi-coherent interface along with the thermoelectric matrix may be contained in an amount of about 0.1 volume % or more, for example, about 0.1 volume % to about 10 volume %, based on a total volume of the thermoelectric material.

The metal additive may have a planar, columnar, acicular, or spherical structure. In the case of a planar structure, the metal additive may be present along the grain boundary of the thermoelectric material. In the case of a spherical structure, it may be present inside the grains of the thermoelectric material.

The thickness of the planar metal additive (e.g., a sectional length) may be about 1 nm to about 100 nm, specifically about 2 nm to about 80 nm. The radius of the spherical metal additive may be about 1 nm to about 100 nm, specifically about 2 nm to about 80 nm.

The metal additive which forms a semi-coherent interface with the grains of the thermoelectric matrix may include a metal, for example, at least one selected from a transition metal, Group 1 element, Group 2 element, Group 13 element, Group 14 element, Group 15 element, and a Group 16 element, except for non-metals.

Tellurium is specifically mentioned. Tellurium (symbol: Te, atomic number: 52) is a Group 16 element, has a hexagonal structure, a lattice constant a of 4.458 Å, and a lattice constant c of 5.927 Å. Te has a matching lattice structure which has a lattice constant difference in the range of about 3% or less between tellurium and the thermoelectric matrix with a composition of Formula 1, e.g. a $(Bi,Sb)_2(Te,Se)_3$-based thermoelectric material. Therefore, a semi-coherent interface comprising dislocations along a grain boundary may be formed between tellurium and the $(Bi,Sb)_2(Te,Se)_3$-based thermoelectric material. The semi-coherent interface may have regularly spaced dislocations. Also, each dislocation can form a strain-field domain structure. The dislocations may be present at high density on the interface of the $(Bi,Sb)_2(Te,Se)_3$-based thermoelectric material. The dislocation density may be in a range of about $10^{10}$ to about $10^{12}$/cm$^2$. For example, the dislocation density may be about $10^{11}$/cm$^2$.

The metal additive, which can form a semi-coherent interface with the grains in the thermoelectric matrix may include, for example, a chalcogenide compound. The chalcogenide compound may comprise at least one of S, Se, and Te bound to a metal, and the metal may be one or more selected from Bi, Sb, Pb, Sr, Ag, a rare earth element, and a transition metal.

The metal additive may comprise a combination of the metal and the chalcogenide compound, and the metal and the metal of the chalcogenide compound may be the same or different.

When a semi-coherent interface is formed between the grains of the thermoelectric matrix as described above, the semi-coherent interface may be between the grains of the thermoelectric matrix which directly contact, and/or may be present between the grain of the thermoelectric matrix and the metal additive when the thermoelectric material includes the metal additive.

As described above, regular high density dislocations may be formed on the grain boundary or on the interface between the grains and the metal additive due to the lattice matching. The dislocations may be formed at high density and at an interval of about 1 nm to about 20 nm, specifically about 2 nm to about 10 nm.

In an embodiment, the {0 1 10}, {0 1 11}, {1 1 0}, {0 0 15}, {1 1 −6} faces of a $(Bi,Sb)_2(Te,Se)_3$-based lattice, respectively, have a similar interplanar distance of about 2.35, 2.22, 2.13, 2.03, and 1.96 Å, respectively, and thus when the crystal orientation is rearranged lattice mis-matching may occur, and misfit dislocations may be formed between adjacent grains of the $(Bi,Sb)_2(Te,Se)_3$-based material.

The misfit dislocations formed on the grain boundary or on the interface between the grains and the metal additive and complex dislocations which may be generated as a result of their correlation form a strain field, thereby considerably reducing the lattice thermal conductivity via phonon scattering. Further, the misfit dislocations may be formed at a high density, e.g., at intervals of about a few nm to about a few tens of nm, thus being effective in reducing thermal conductivity. As the thermal conductivity becomes drastically reduced, the thermoelectric material may have a thermal conductivity of about 0.4 Watts per meter-Kelvin (W/mK) or less, specifically about 0.35 W/mK or less, or about 0.35 W/mK to about 0.1 W/mK, at room temperature, for example, about 300 K.

Such reduced thermal conductivity indicates the improvement in the thermoelectric figure of merit (ZT). The metal additive-containing thermoelectric material may have a ZT of about 1.3 or more, for example, about 1.5 or more, or about 1.6 to about 3.0, at room temperature, for example, about 300 K.

In an embodiment, thermoelectric materials with high ZT may be obtained, for example, having high thermoelectric performance at elevated temperature. Used herein, elevated temperature refers to a range of about 600 K or less, for example about 550 K or less, or about 400 K or less. For example, elevated temperature may be about 200 K to about 400 K, about 250 K to about 350 K.

A method of manufacturing the thermoelectric material is further described below.

The thermoelectric material may be manufactured by steps including: heating a precursor material comprising a flux and a composition of Formula 1 to obtain a melt, $$(Bi_xSb_{1-x})_a(Te_ySe_{1-y})_b \qquad \text{Formula 1}$$

wherein 1.8≤a≤2.2, 2.8≤b≤3.2, 0≤x≤1, and 0≤y≤1; rapidly solidifying the melt to form a solidified intermediate; and pressure-sintering of the intermediate to obtain the thermoelectric material, wherein the thermoelectric material has a plurality of dislocations present along a grain boundary between adjacent grains of the composition of Formula 1. During the pressure-sintering of the solidified intermediate, the flux is removed.

The flux may comprise at least one selected from a transition metal, Group 1 element, Group 2 element, Group 13 element, Group 14 element, Group 15 element, and a Group 16 element, except for non-metals, and/or a chalcogenide compound. The chalcogenide compound may comprise at least one of S, Se, and Te bound to a metal, and the metal may be one or more selected from Bi, Sb, Pb, Sr, Ag, a rare earth element, and a transition metal. Tellurium is specifically mentioned.

In another embodiment, a method for manufacturing a thermoelectric material may comprise: heating a precursor material comprising an additive and a composition of Formula 1 to obtain a melt $$(Bi_xSb_{1-x})_a(Te_ySe_{1-y})_b, \qquad \text{Formula 1}$$

wherein 1.8≤a≤2.2, 2.8≤b≤3.2, 0≤x≤1, and 0≤y≤1; rapidly solidifying the melt to form a solidified intermediate; and pressure-sintering the solidified intermediate to form a thermoelectric matrix comprising grains with a composition of Formula 1 obtain the thermoelectric material, wherein the thermoelectric material has a semi-coherent interface between a grain of the composition of Formula 1 and the additive.

The rapidly solidifying may comprise a eutectic reaction.

The additive, e.g., the metal additive, may be used as a precursor material and may remain in part in the resulting product.

The rapid solidifying to provide the thermoelectric material may include melt-spinning or gas atomization, and the rapidly solidifying may be followed by pressure-sintering in this order.

Melt-spinning is a method for rapid solidification by spraying a melt of a material onto a rotating metal wheel. For example, a ribbon-shaped intermediate, wherein the additive is precipitated, can be obtained by a process which includes heating and melting the precursor material including the thermoelectric matrix and the flux or additive to form a melt, discharging the melt from a nozzle onto a rotating metal wheel, thereby subjecting the melt to cooling and solidification. The intermediate is obtained in a form wherein the thermoelectric material and the flux or additive are dispersed due to the effect of rapid cooling. Further, by subjecting the intermediate to pressure-sintering, a thermoelectric material having a semi-coherent interface on the grain boundary between the grains of the thermoelectric matrix and/or on the interface between the grains and the additive is provided.

The gas atomization is a method to obtain metal powders by spraying a melted metal through an orifice by pressure. As the melted metal passes through a nozzle by gas pressure, the turbulence generated therein causes atomization of the metal. This intermediate is obtained in the form where the atomized thermoelectric material and additive are dispersed. Then, as the intermediate is subjected to pressure-sintering, the additive is melted into a liquid state and rearranges the grains in the thermoelectric matrix, thereby obtaining a thermoelectric material wherein a semi-coherent interface is formed between the grains.

A melt-spinning method is used to form an interface that includes high density dislocations between the grains, and/or between the grains and the additive. For example, the melt-spinning method may be performed to provide a rapid solidification by dropping a thermoelectric matrix melt on a copper wheel rotating at high speed via a quartz tube nozzle, and, as a result, a ribbon-shaped material with a thickness of about 1 micrometer (μm) to about 100 μm may be obtained. The ribbon is obtained in the form where the additive is dispersed in the thermoelectric material, and, due to the effect of the rapid cooling, the thermoelectric material, and the additive may be obtained in the size of about a few tens of nanometers to about a few hundreds of nanometers, specifically about 10 nm to about 500 nm.

Figure 5:
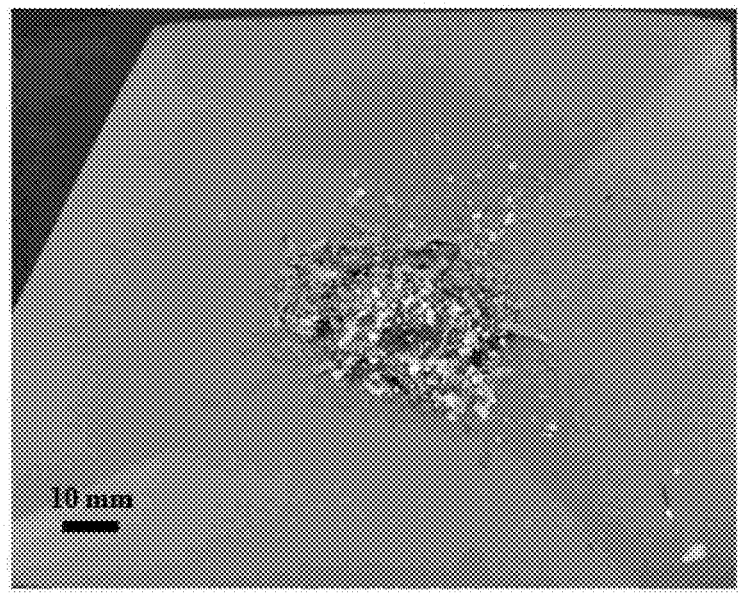
FIG. 5 shows ribbons prepared in Example 1.
Figure 6:
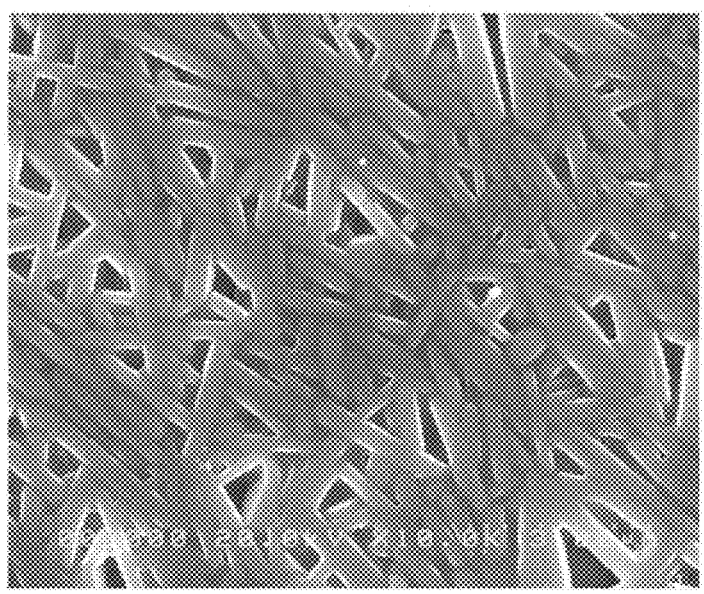
FIGS. 6 to 9 respectively show surface a microstructure of ribbons prepared in Example 1.
Figure 7:
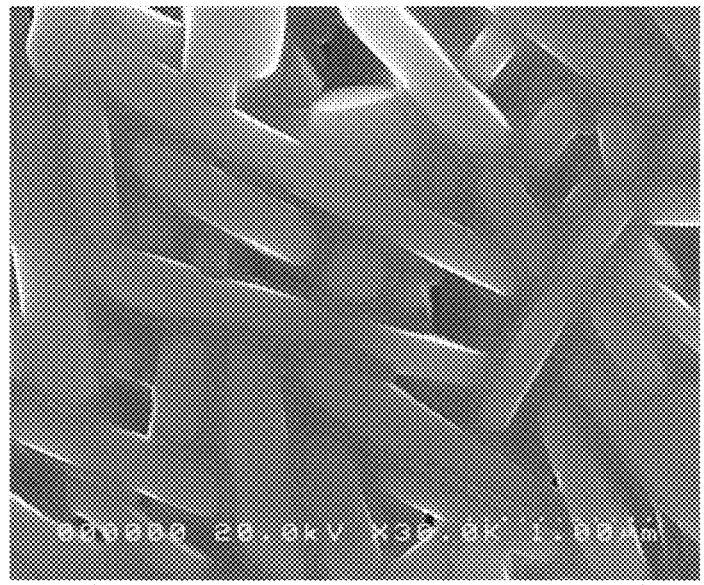
Figure 8:
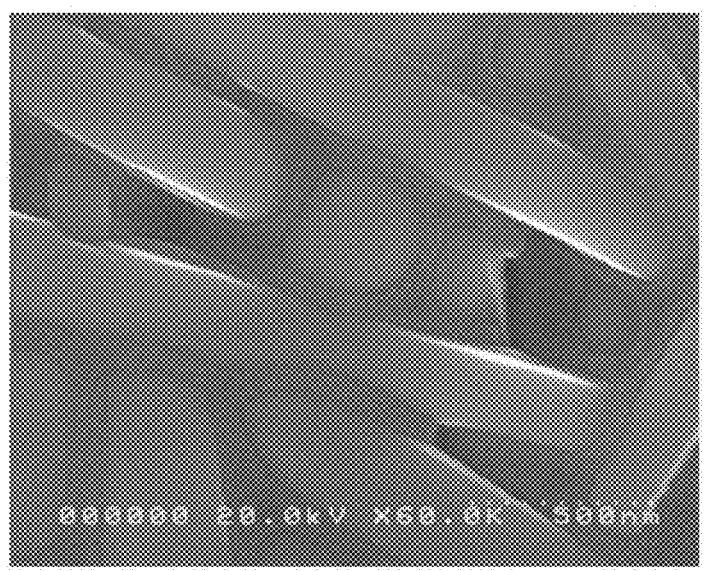
Figure 9:
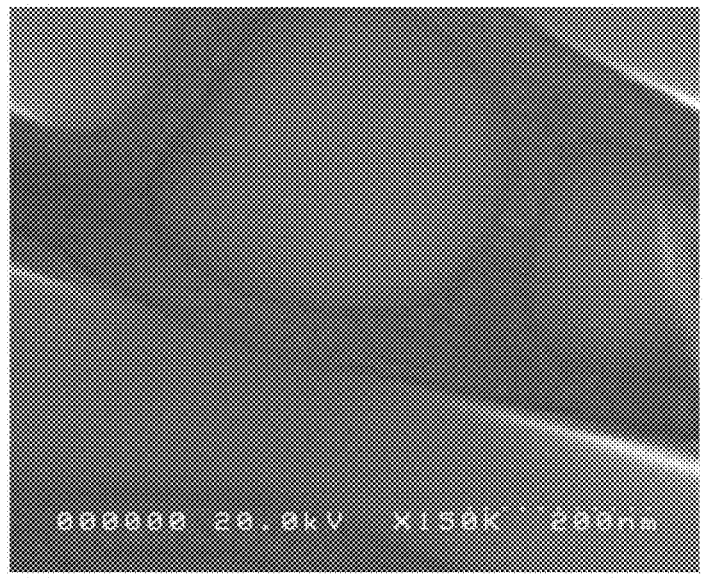

For example, when a ribbon is formed via melt-spinning as shown in FIG. 5 using $Bi_{0.5}Sb_{1.5}Te_3$ as a material for the thermoelectric matrix and Te as a metal additive, the surface shape of the ribbon may be formed as shown in FIGS. 6 and 7. When Te as a metal additive is added to the $Bi_{0.5}Sb_{1.5}Te_3$ melt in stoichiometric excess, there occurs a eutectic decomposition during crystallization which causes precipitation of Te. Here, Te precipitation is very uniformly dispersed, and Te particles may be intercalated onto each facet of the $Bi_{0.5}Sb_{1.5}Te_3$, as shown in FIGS. 8-11. As described above, this may be a suitable condition for improving the interface density of $Bi_{0.5}Sb_{1.5}Te_3$/Te and providing a high density of misfit dislocations.

The melt-spinning to be used may be any method known in the related art, and there is no limitation thereto. For example, as the cooling speed becomes faster, the interface density of $Bi_{0.5}Sb_{1.5}Te_3$/Te becomes greater.

After pulverizing the ribbon-shaped intermediate prepared via melt-spinning, for example, pressure-sintering may be performed using spark plasma sintering. In the pressure-sintering, the sintering temperature may be higher than the melting temperature of the additive, for example a temperature 30° C. greater than the melting temperature of tellurium, specifically about 1° C. to about 100° C. greater than the melting temperature of tellurium, so that the thermoelectric matrix, for example, the $Bi_{0.5}Sb_{1.5}Te_3$/Te interface, can become a semi-coherent state.

The melting temperature of tellurium under atmospheric pressure is 449.57° C., and the melting temperature of tellurium becomes lower depending on the pressure being employed. While not wanting to be bound by theory, it is understood that this is because the crystallization of the crystal face of $Bi_{0.5}Sb_{1.5}Te_3$ may begin after tellurium changes into a liquid phase. Since the tellurium is in the liquid phase during pressure-sintering, a part of tellurium may be eluted to the outside. Accordingly, the flux, e.g., tellurium, may be removed by use of a sintering temperature higher than a melting point of the flux.

The pressure to be employed during pressure-sintering is about 30 megaPascals (MPa) or greater, for example, in the range of about 40 MPa to about 100 MPa.

Further exemplary embodiments of manufacturing the thermoelectric material are described below.

The thermoelectric material may be obtained by steps which include:

contacting, e.g., mixing, a precursor material including a metal additive and a thermoelectric matrix having grains with a composition of Formula 1 in the form of a powder form via milling process to obtain a mixed powder; and pressure-sintering the mixed powder to obtain the thermoelectric material having a semi-coherent interface between the grains and/or on the interface between the grains and the metal additive;

$(Bi_xSb_{1-x})_a(Te_ySe_{1-y})_b$    Formula 1 wherein, 1.8≤a≤2.2, 2.8≤b≤3.2, 0≤x≤1, and 0≤y≤1.

The thermoelectric material may be manufactured, for example, by preparing a mixed powder having an average particle size of about a few tens of nm to about a few tens of μm, e.g., about 10 nm to about 100 μm, specifically about 20 nm to about 50 μm, via high energy milling, followed by pressure-sintering, in this order. During the pressure-sintering, and while not wanting to be bound by theory, it is understood that it is believed that the additive melts and rearranges the grains in the thermoelectric matrix, resulting in a thermoelectric material where a semi-coherent interface is formed between the grains, and/or on the interface between the grains and the additive.

The high energy milling to be used may be any suitable method known in the related art, and there is no limitation thereto. For example, as the size of the mixed powder becomes smaller, the interface density of $Bi_{0.5}Sb_{1.5}Te_3$/Te becomes greater.

The pressure-sintering may be performed as is the case with the use of the above-mentioned melt-spinning method.

As described above, the thermal conductivity of the thermoelectric material can be considerably reduced by employing the process of producing the semi-coherent interface at high density by uniformly adding the additive to the thermoelectric matrix. The reduced thermal conductivity indicates the improvement in the thermoelectric performance.

In the case of a thermoelectric material which includes a metal additive obtained by the above process, it is possible to perform an additional high densification process. The high densification process will enable further improvement in thermal conductivity.

In another embodiment, a thermoelectric device may be obtained by molding the thermoelectric materials prepared according to the embodiments via a process such as cutting process.

The thermoelectric device may be a p-type or n-type thermoelectric device. The thermoelectric device means that the thermoelectric material is molded into a predetermined shape, for example, a hexagonal shape.

In addition, the thermoelectric device may be connected to an electrode and thereby exhibit a cooling effect via applied current, and may serve as a component to provide power generation according to the device or difference in temperature.

Figure 2:
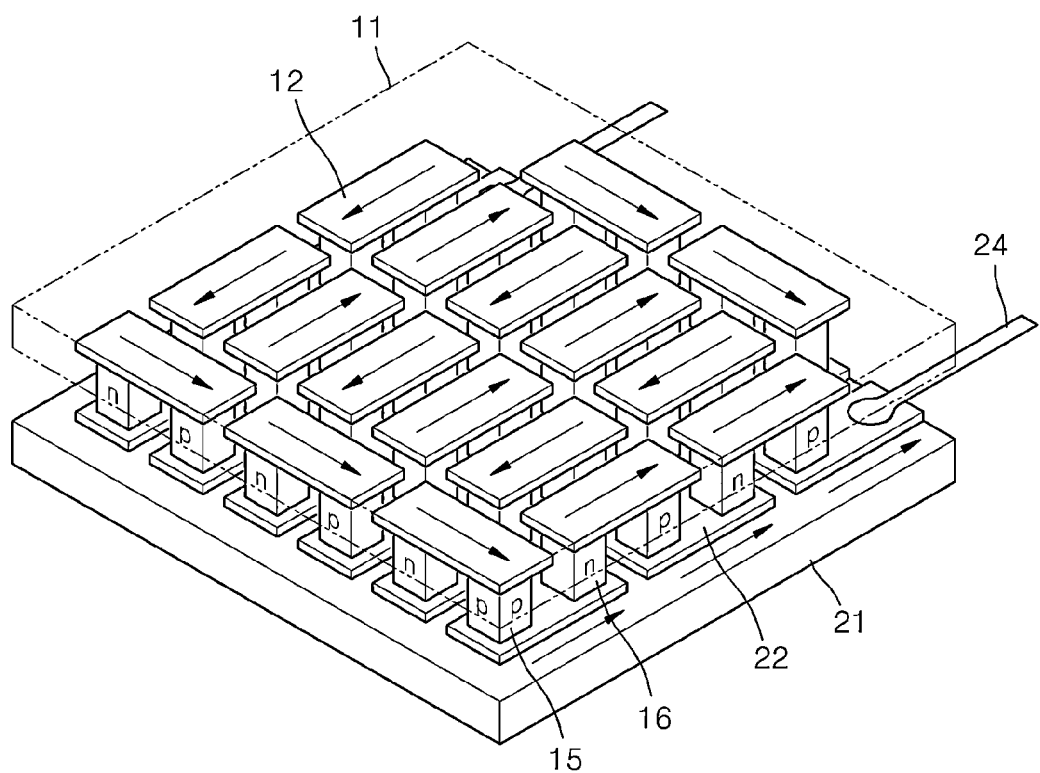
FIG. 2 shows a schematic diagram of an embodiment of a thermoelectric module employing an embodiment of a thermoelectric device.

FIG. 2 shows a thermoelectric module employing a thermoelectric device according to an embodiment. As shown in FIG. 2, in the upper insulating substrate 11 and the lower insulating substrate 21, there are formed the upper electrode 12 and the lower electrode 22 in patterns, and the upper electrode 12 and the lower electrode 22 are in contact with p-type thermoelectric component 15 and n-type thermoelectric component 16. These electrodes 12 and 22 are connected to the external part of the thermoelectric device via lead electrode 24.

As the insulating substrate 11 and 21, a GaAs, sapphire, silicon, PYREX, or quartz substrate, for example, may be used. The material for these electrodes 12 and 22 may be selected from aluminum (Al), nickel (Ni), aurum (Au), or titanium (Ti), for example, and its size may be any suitable size. The patterning method to be used for these electrodes 12 and 22 may be any method known in the related art, for example, a lift-off semiconductor process, deposition method, photolithography, etc.

In another embodiment, there is provided a thermoelectric module that includes the first electrode, the second electrode, and a thermoelectric device including the thermoelectric material according to Formula 1 disposed between the first electrode and the second electrode. The thermoelectric module may further include an insulating substrate where at least one of the first electrode and the second electrode is provided. As such, an insulating substrate the above-mentioned insulating substrate may be used.

In an embodiment of the above thermoelectric module, one of the first electrode and the second electrode may be electrically connected to a power supply.

In an embodiment of the thermoelectric module, the p-type thermoelectric device and the n-type thermoelectric device may be reciprocally arranged as shown in FIG. 2. Further, at least one of the p-type thermoelectric device and n-type thermoelectric device may include a thermoelectric material having the nano inclusion intercalated therein.

Figure 3:
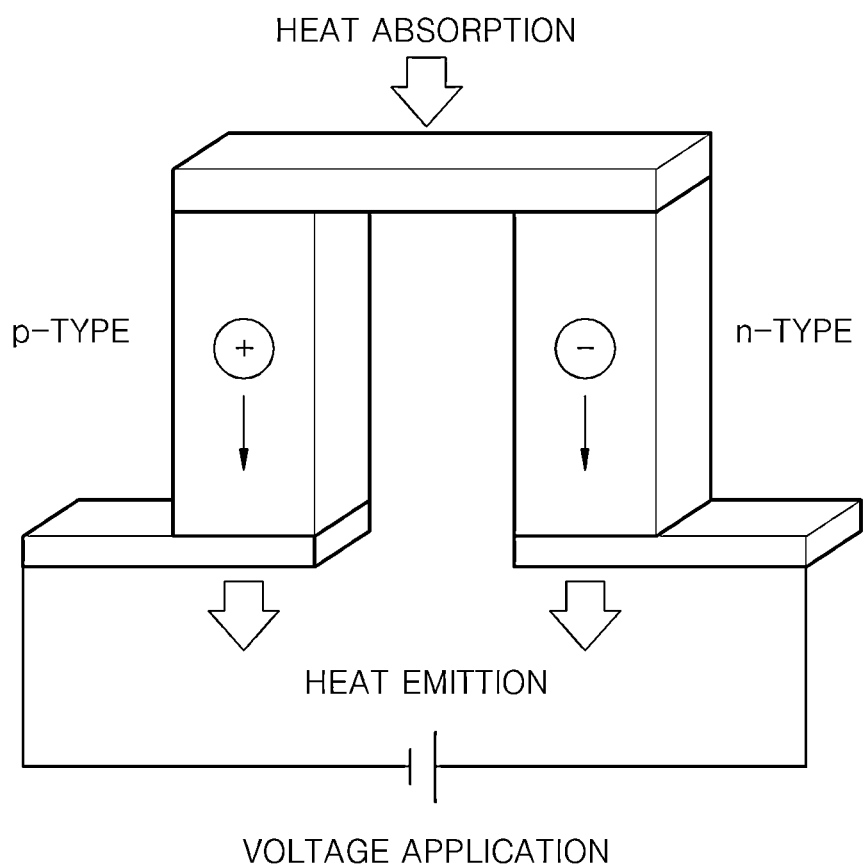
FIG. 3 shows a schematic diagram of another embodiment of a thermoelectric module employing an embodiment of the thermoelectric device.
Figure 4:
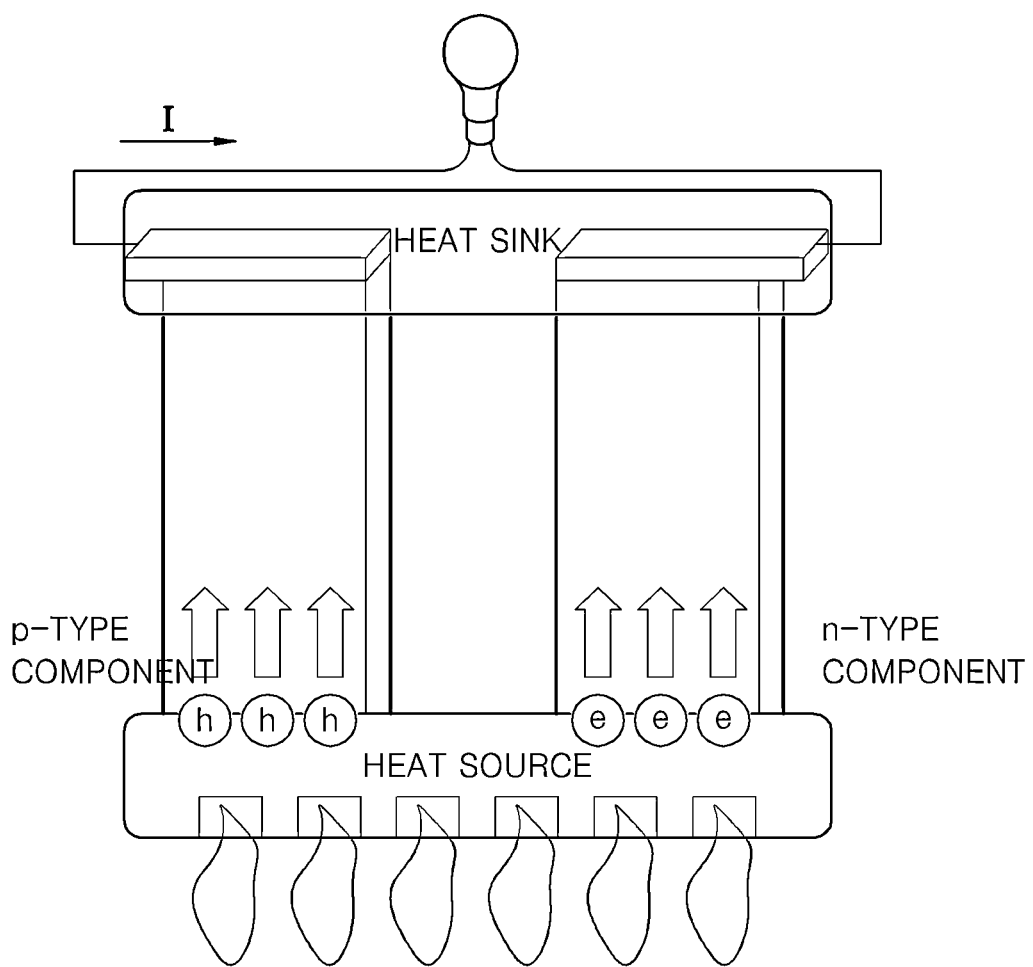
FIG. 4 shows a schematic diagram of another embodiment of a thermoelectric module employing an embodiment of the thermoelectric device.

In an embodiment of the thermoelectric module, at least one of the first electrode and the second electrode may be exposed to a heat supply source as shown in FIGS. 3 and 4. In an embodiment of the thermoelectric device, at least one of the first electrode and the second electrode may be electrically connected to a power supply source as shown in FIG. 3, or be electrically connected to an exterior of the thermoelectric module, for example, an electric device, for example a battery, which consumes or stores electric power as shown in FIG. 4.

Hereinafter reference will now be made in detail to various embodiments, examples of which are illustrated in the accompanying drawings and described below. While the invention will be described in conjunction with exemplary embodiments, it will be understood that present description is not intended to limit the invention to those embodiments. On the contrary, the invention is intended to cover not only the embodiments, but also various alternatives, modifications, equivalents and other embodiments, all of which may be included within the spirit and scope of this disclosure.

Example 1

1) Ribbon Preparation—Melt Spinning

Melt Spinning was used to uniformly disperse tellurium in $Bi_{0.5}Sb_{1.5}Te_3$, which is a thermoelectric matrix with a crystalline grain structure.

When an excess amount of tellurium is added to melted $Bi_{0.5}Sb_{1.5}Te_3$ for solidification, excess tellurium is precipitated via eutectic decomposition. Because tellurium is precipitated during crystallization of $Bi_{0.5}Sb_{1.5}Te_3$ in the course of rapid solidification, a ribbon having the desired structure may be prepared. Further, a nano structure is formed during rapid cooling (solidification), and thus a high density of $Bi_{0.5}Sb_{1.5}Te_3$/Te interfaces can be formed.

Figure 10:
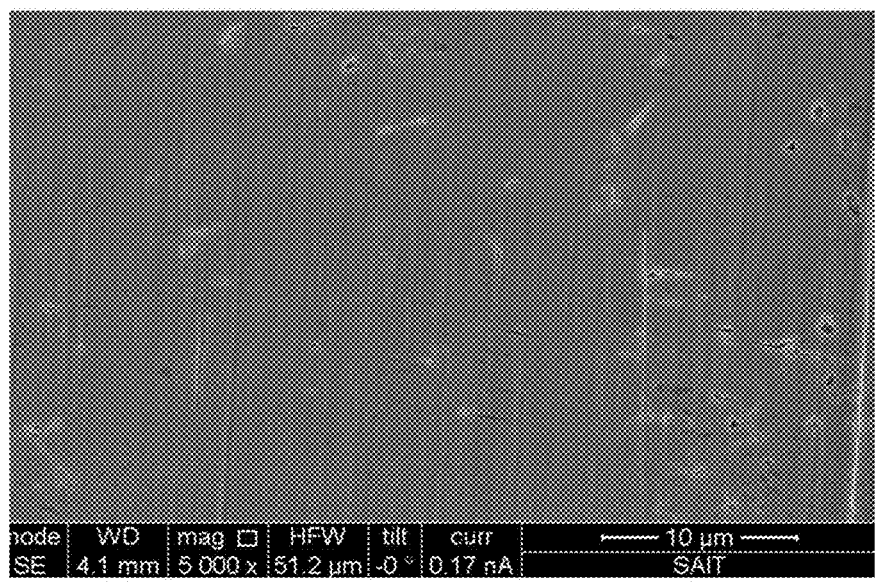
FIGS. 10 to 11 respectively show the microstructure of cross-sections of ribbons prepared in Example 1.
Figure 11:
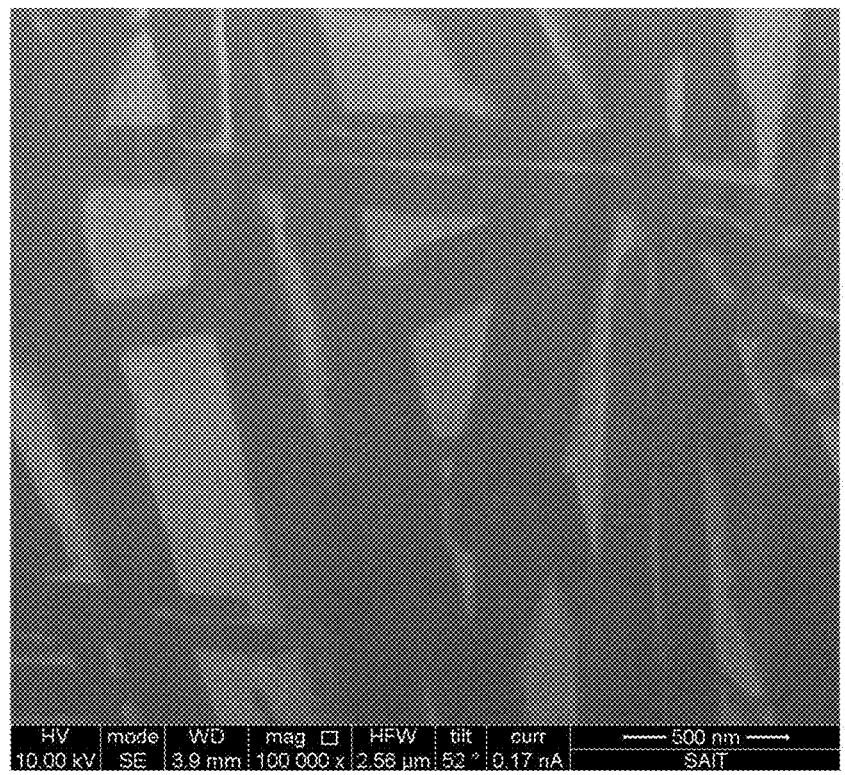

To this end, $Bi_{0.5}Sb_{1.5}Te_3$ material including an excess amount of tellurium of 20 weight percent (weight %) was melted and then subjected to melt-spinning using a copper wheel and a linear velocity of 45 meters per second (m/s), with a quartz tube outlet diameter of 0.3 mm, argon (Ar) pressure of 20 kPa discharge pressure, and about 100-300 mTorr argon atmosphere. The melting of the material was performed via induction melting (35 A, 90 V). As a result, the ribbon as shown in FIG. 5 was obtained, and detailed nano structures of the ribbon are shown in FIGS. 6-11. As can be seen in FIG. 6, it appears as a shape where the facet of the crystal of $Bi_{0.5}Sb_{1.5}Te_3$ is shown from the upper face. As shown in FIG. 7, which is a partial enlarged view of FIG. 6, $Bi_{0.5}Sb_{1.5}Te_3$ and Te particles were precipitated and uniformly dispersed on the facet surface of $Bi_{0.5}Sb_{1.5}Te_3$. In addition, precipitated Te particles were identified in FIGS. 8 and 9, which are partial enlarged views of FIG. 7. FIGS. 10 and 11 show cross-sectional views of ribbons prepared in Example 1.

2) Pressure-Sintering—Spark Plasma Sintering

The ribbon, prepared in the above process with dispersed tellurium, was obtained in powder form by pulverization, and the obtained powder was subjected to pressure-sintering for 3 minutes at 480° C. under 70 MPa via spark plasma sintering, and naturally cooled in a chamber. Because 480° C. is a temperature higher than the melting temperature of tellurium, a certain amount of the tellurium is eluted outside of a pressure mold by the pressure during the sintering process.

3) Structure Analysis

Figure 12:
FIGS. 12 to 13 respectively show transmission electron microscopy ("TEM") images illustrating semi-coherent interfaces of a thermoelectric material prepared in Example 1.
Figure 13:
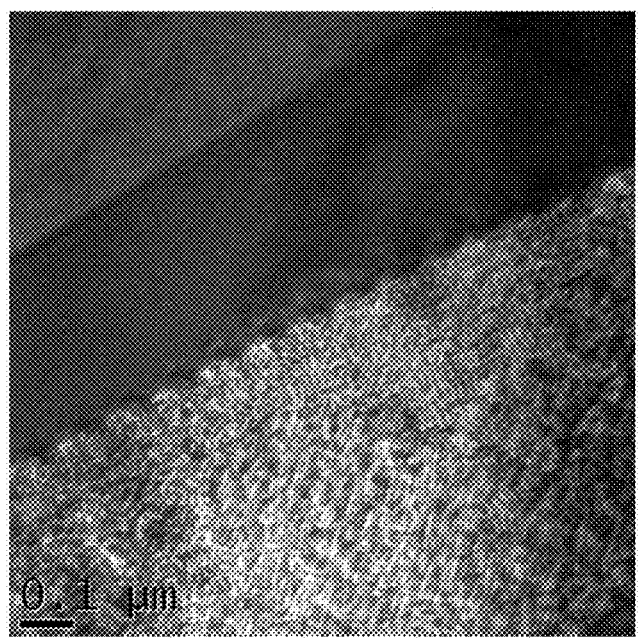

Referring to the above precursor materials $Bi_{0.5}Sb_{1.5}Te_3$ and Te, Te has a hexagonal structure where a=4.458 Å and c=5.927 Å, and $Bi_{0.5}Sb_{1.5}Te_3$ has a rhombohedral structure where a=4.292 Å and c=30.45 Å, and a lattice mismatch between the two is less than 3%. In the c-axis direction of $Bi_{0.5}Sb_{1.5}Te_3$, five similar lattices are stacked up, establishing a lattice matching with the five lattices along the c-axis of Te. The calculation of the interval and the distance of lattices where dislocations are formed reveals that there are dislocations of y*30.45=(y+1)*(5*5.927) toward a c-axis, where y is about 36, indicating the presence of dislocations at intervals of 36 lattices, which is about 36*30.45, i.e., 1,107 angstroms (Å) (about 110 nm). That is, a dislocation is present at intervals of 110 nm toward the c-axis, which is the dislocation observed at intervals of about 100 nm in FIGS. 12 and 13. FIG. 12 shows a TEM image of a semi-coherent interface (c-axis) of $Bi_{0.5}Sb_{1.5}Te_3$ and Te obtained in the above pressure-sintering, and FIG. 13 shows a partial enlarged view.

Figure 14:
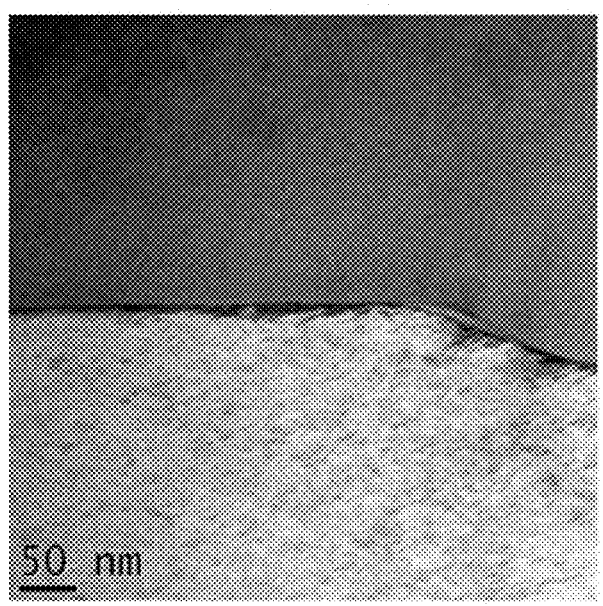
FIGS. 14 to 15 respectively show TEM images illustrating semi-coherent interfaces of a thermoelectric material prepared in Example 1.
Figure 15:
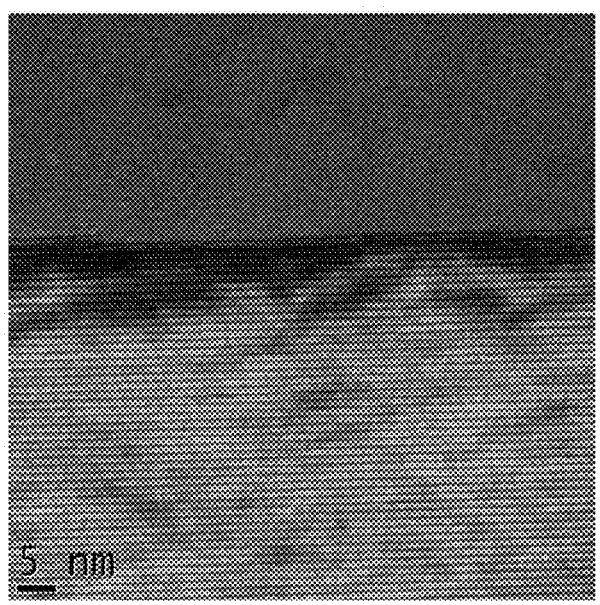

Further, toward the a-axis direction, an x lattice interval is present, calculated via x*4.458=(x+1)*4.292, where x is about 26. That is, there is one dislocation at intervals of 26 lattices, and the distance is 26*4.458 Å, which is about 115 Å (11.5 nm). FIG. 14 shows a TEM image of a semi-coherent interface (a-axis) of $Bi_{0.5}Sb_{1.5}Te_3$ and Te obtained in the above pressure-sintering, and FIG. 15 shows a partially enlarged view. The TEM images shown in FIGS. 14 and 15 illustrate the interface toward the direction of a-axis, the interval being about 10 nm, and there is observed to be an overlap in the region of the strain field. The interfaces shown in FIGS. 12-15 are present as surfaces and not as lines, and, toward the interface in-plane direction, there is a structure formed with a two-dimensional and very dense dislocation. This shows one example where a semi-coherent interface of $Bi_{0.5}Sb_{1.5}Te_3$ and Te may occur. Further, in other facets of the surfaces which are not in parallel with the a-axis or the c-axis, various forms of dense dislocations may be formed, and the strain field around the dislocations may affect the decrease in thermal conductivity. For example, there may be present a semi-coherent interface of $Bi_{0.5}Sb_{1.5}Te_3$ and Te, where the a-axis is arranged at 30° intervals.

FIGS. 12-15 show dislocations of simple facet surfaces. Also, FIGS. 16-22 are TEM images of the ribbon preparation and final products obtained via pressure-sintering showing the multiple complex dislocations and threading dislocations and/or tangled dislocations developed from the dislocations.

Figure 16:
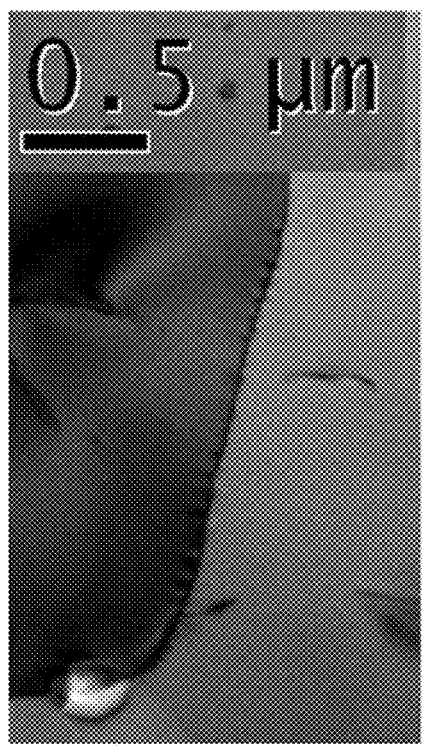
FIGS. 16 to 22 respectively show TEM images illustrating semi-coherent interfaces of a thermoelectric material prepared in Example 1.
Figure 17:
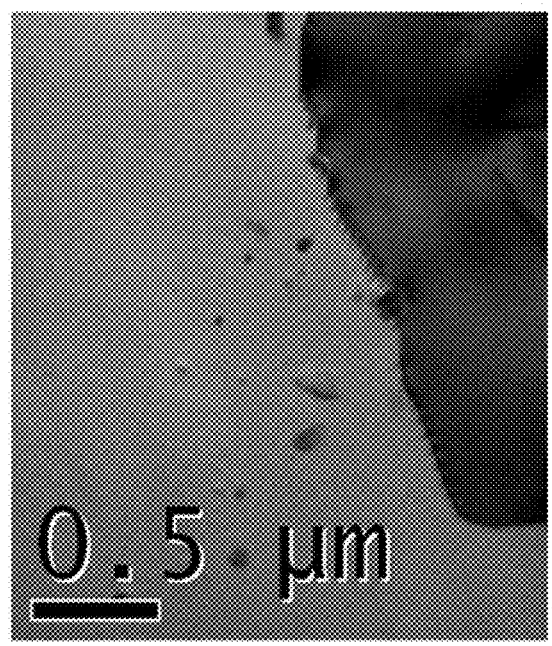
Figure 18:
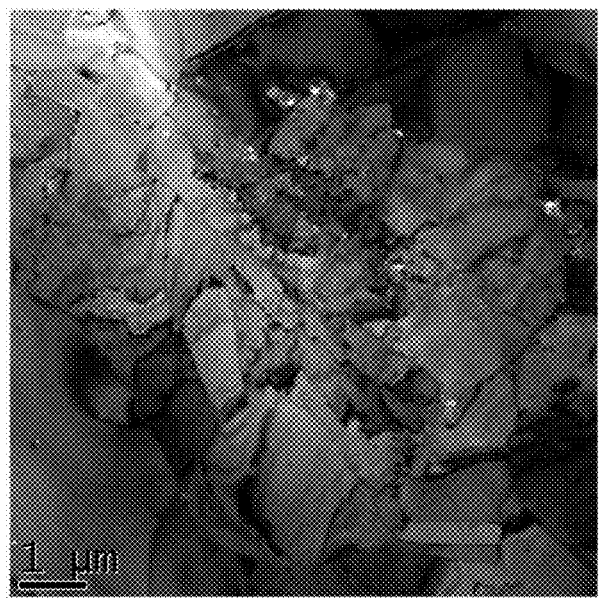
Figure 19:
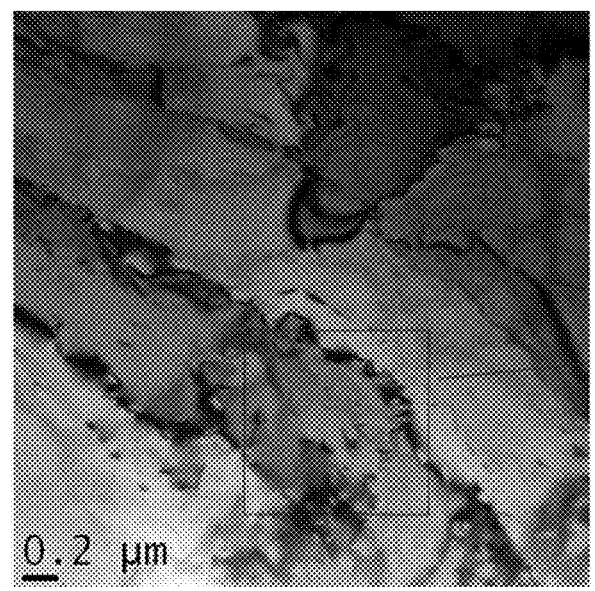
Figure 20:
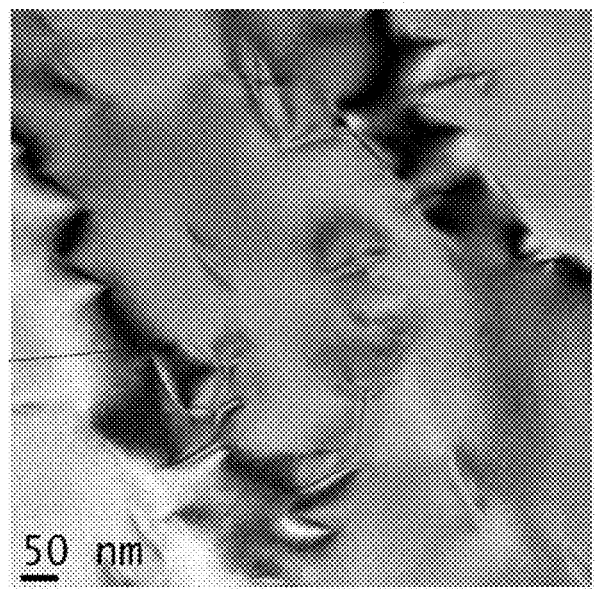
Figure 21:
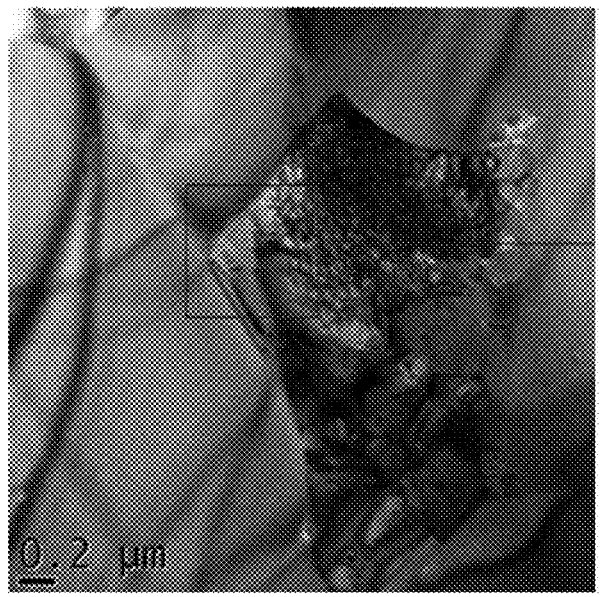
Figure 22:
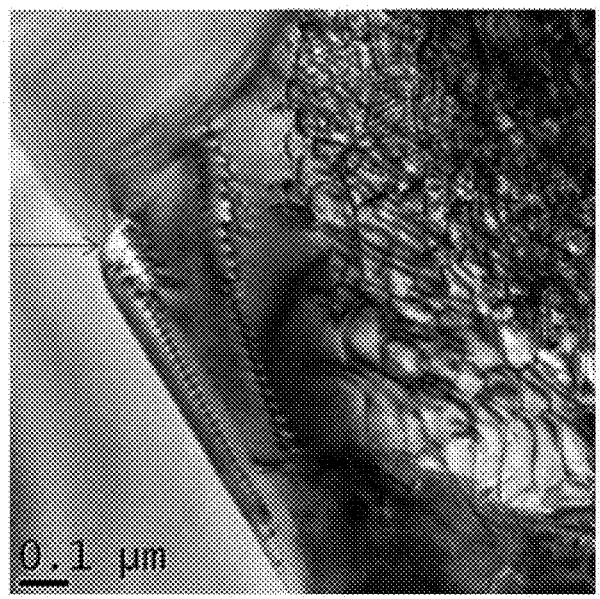
Figure 23:
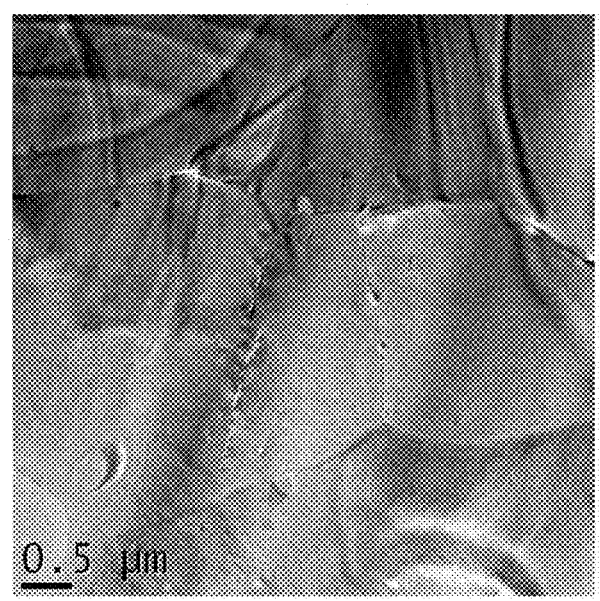
FIGS. 23 to 29 respectively show TEM images illustrating semi-coherent interfaces of a thermoelectric material prepared in Example 1.
Figure 24:
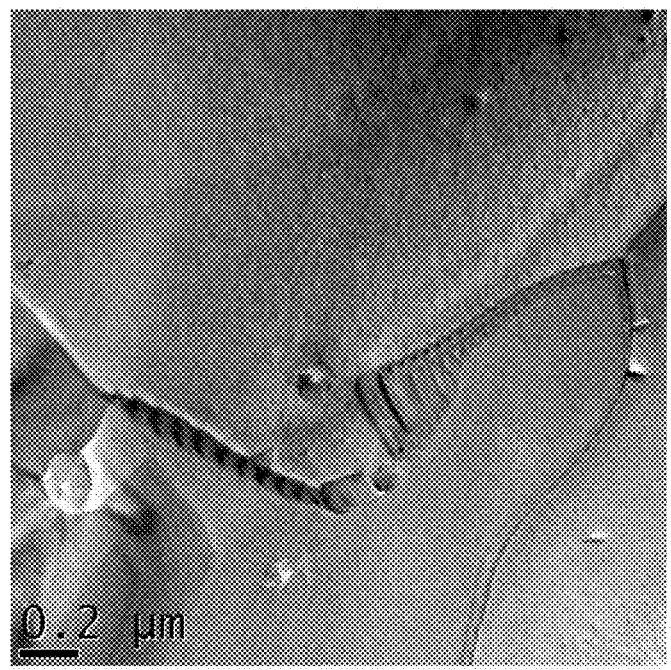
Figure 25:
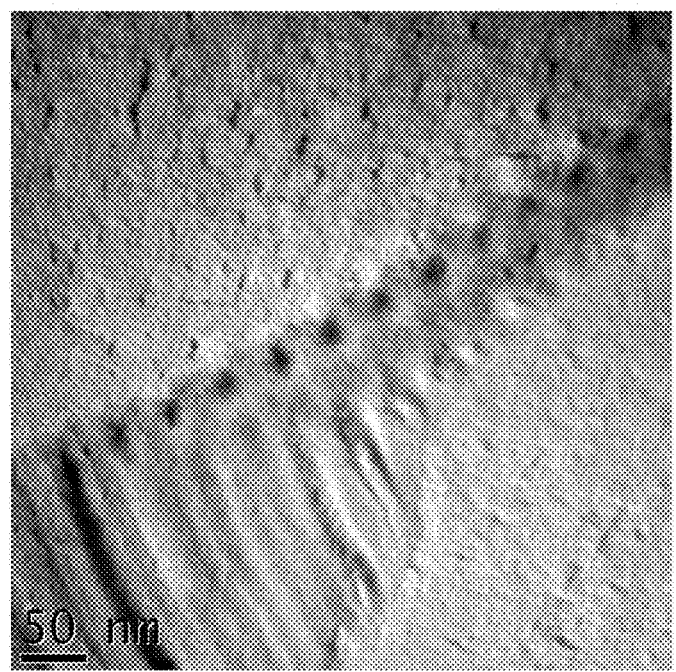
Figure 26:
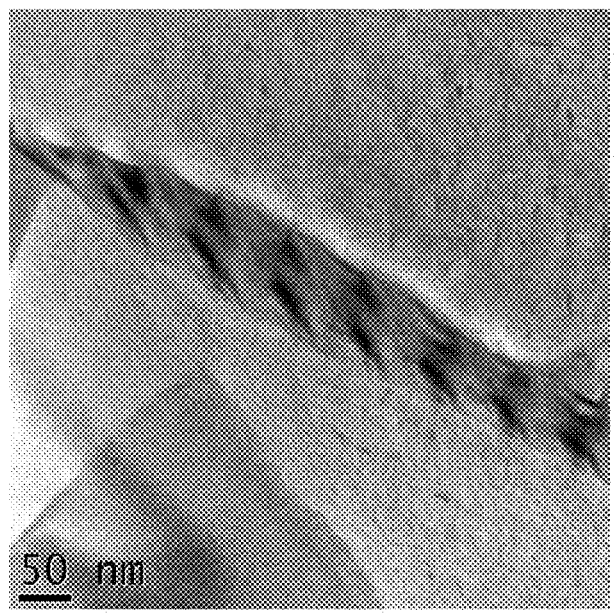

FIGS. 16 and 17 show the periodic dislocations observed in the $Bi_{0.5}Sb_{1.5}Te_3$/Te interface, and FIG. 18 shows that many dislocations are intricately intermingled over a wide range. FIG. 19 and FIG. 20, which is a partial enlarged view of FIG. 19, show the threading dislocations appearing as lines due to the continuous occurrence of dislocations that result when the dislocation interval is narrow or the range of strain field is overlapped. FIG. 21 and FIG. 22, which is a partial enlarged view of FIG. 21, also show tangle dislocations intermingled due to the narrow interval between the dislocations. FIGS. 23-27 respectively show dislocations additionally formed along the grain boundary.

Figure 27:
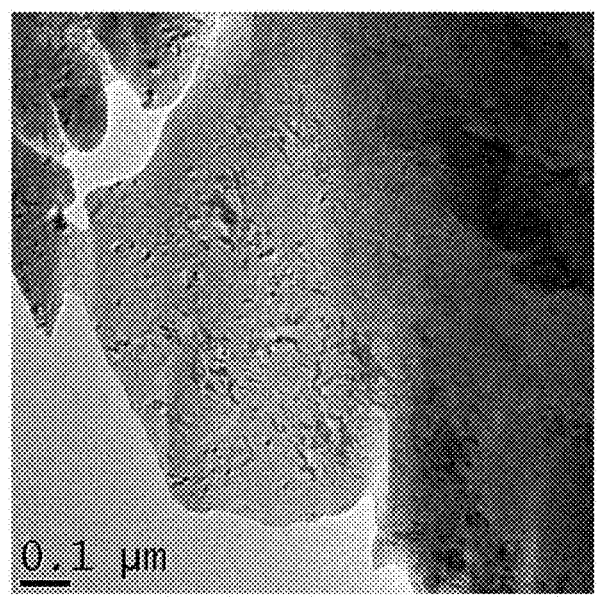
Figure 28:
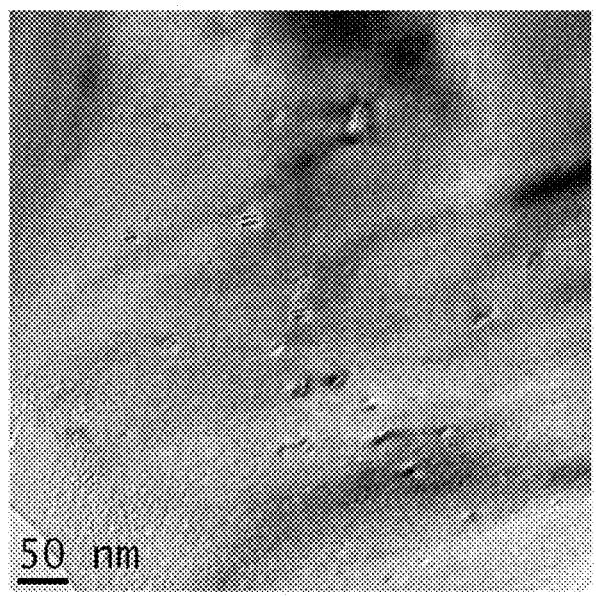
Figure 29:
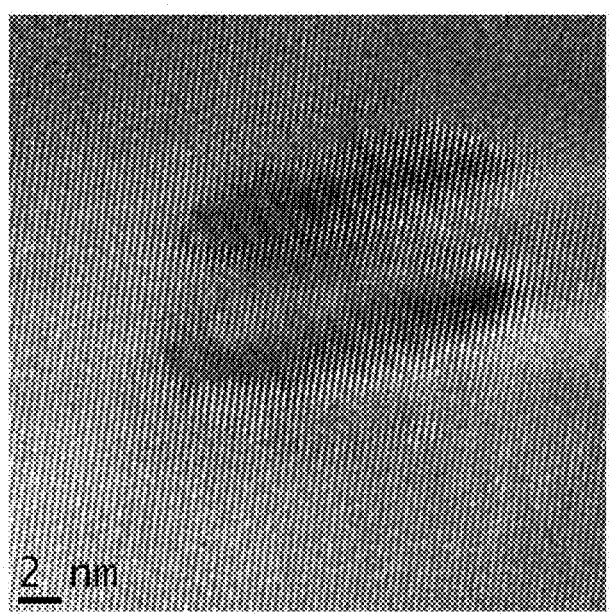

FIG. 27-29 show tellurium nanoparticles formed within the grains, and dislocations are observed around the nanoparticles. The tellurium nanoparticles formed within the grains appear so that the tellurium nanoparticles, which have been under supersaturation during a rapid cooling process, are deposited on a nano scale during the sintering process.

FIGS. 36A, 36B, 36C, and 36D show TEM images of thermoelectric materials prepared in Example 1, wherein the images are respectively at different magnifications, and a high defect density is observed among grains at high magnification. It appears that dislocations might have occurred at both interfaces, thereby forming a dislocation loop.

Figure 37A:
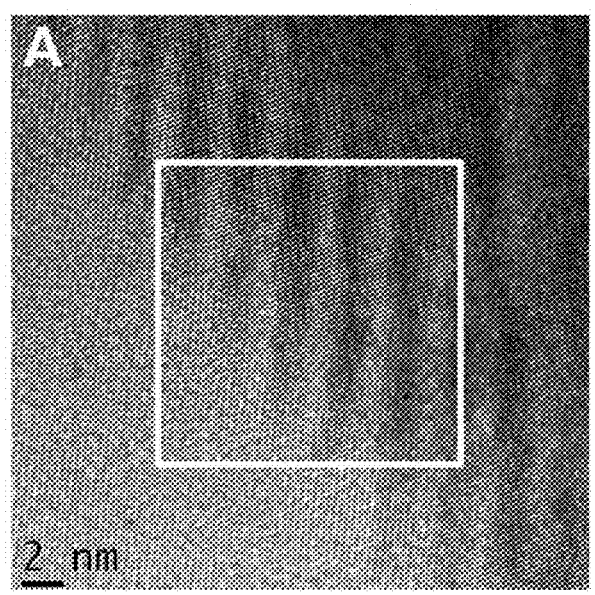
FIG. 37A shows a TEM image of a thermoelectric material prepared in Example 1.
Figure 37B:
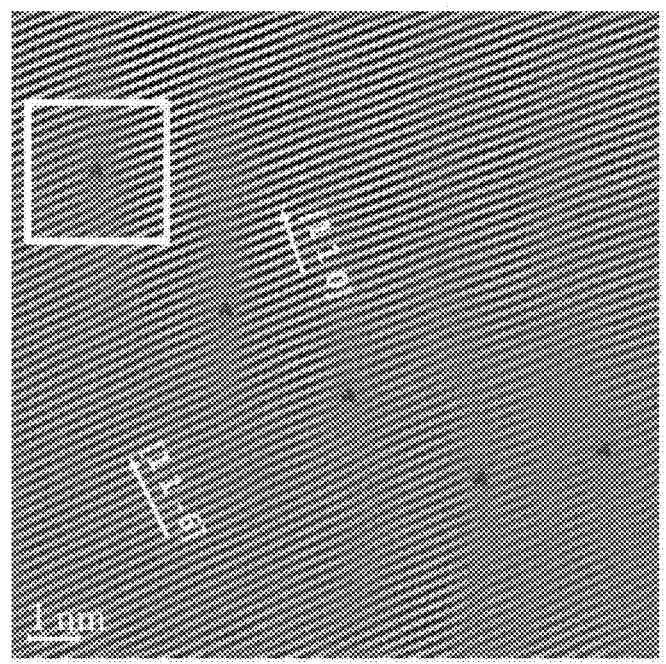
FIGS. 37B and 37C shows a filtered image of spots on a (1 1 −6) face and a (1 1 0) face of $Bi_{0.5}Sb_{1.5}Te_3$, respectively, in the lattice diffraction pattern of a TEM image having dislocations illustrating a regular structure of dislocations.
Figure 37C:
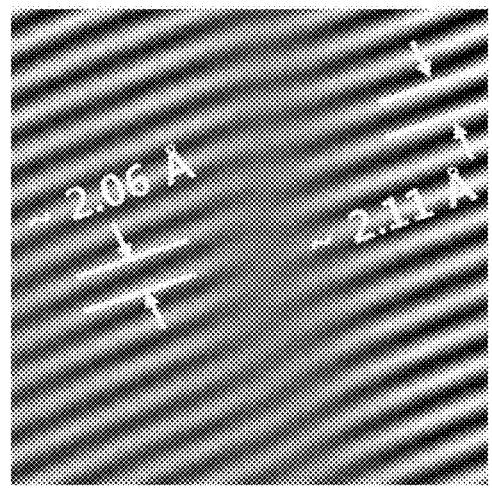

FIG. 37A shows a TEM image of thermoelectric materials prepared in Example 1. FIGS. 37B and 37C show a filtered image of spots on a $Bi_{0.5}Sb_{1.5}Te_3$ (1 1 −6) face and a (1 1 0) face in the lattice diffraction pattern of TEM image, with a dislocation clearly illustrating a regular structure of dislocation.

Figure 38A:
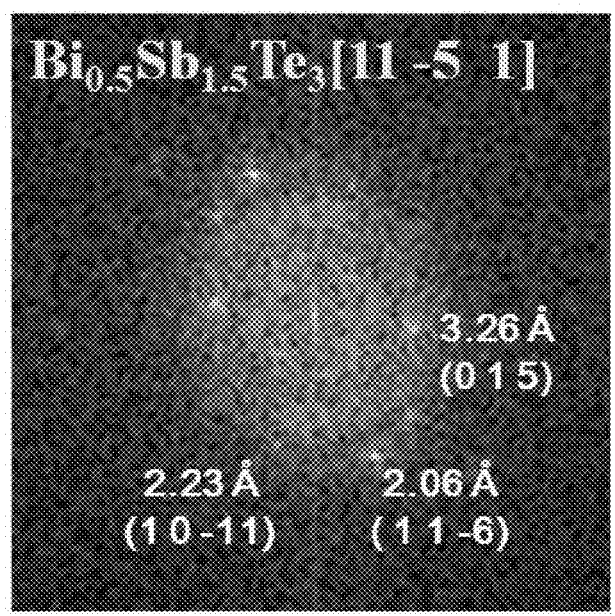
FIGS. 38A and 38B respectively show lattice diffraction patterns of FIGS. 37A and 37B in Example 1.
Figure 38B:
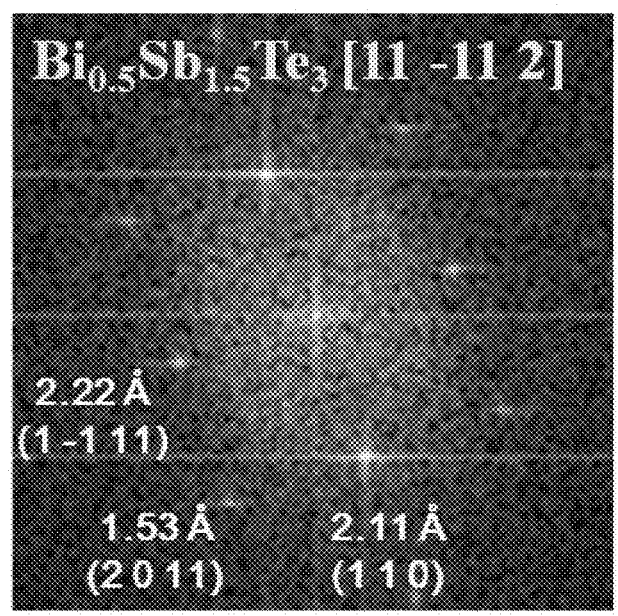

FIGS. 38A and 38B show the lattice diffraction pattern of FIG. 37A prepared in Example 1. FIG. 38A is a zoomed in portion of a lattice diffraction pattern of the left lower portion of FIG. 37A, where $Bi_{0.5}Sb_{1.5}Te_3$ is present at a zone axis of [11 −5 1], and FIG. 38B is an enlarged view of a lattice diffraction pattern of the right upper portion of FIG. 37A, where $Bi_{0.5}Sb_{1.5}Te_3$ is present at a zone axis of [11 −11 2].

From FIGS. 37A-37C, and FIGS. 38A-38B, it is apparent that an interface is present, the interface having a lattice relationship of $Bi_{0.5}Sb_{1.5}Te_3$ [11 −5 1]//[11 −11 2] and $Bi_{0.5}Sb_{1.5}Te_3$ [1 1 −6]//[1 1 0].

Figure 39A:
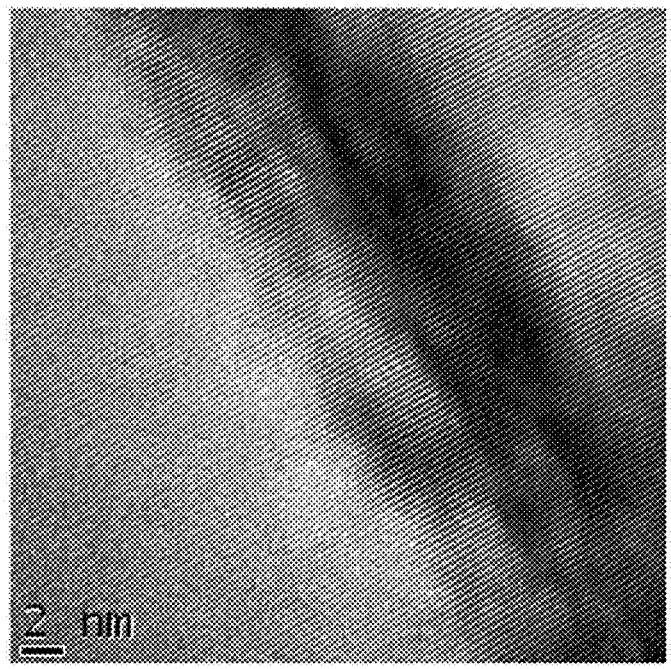
FIG. 39A shows a TEM image of the thermoelectric material prepared in Example 1, wherein a strain field is observed at the interface.
Figure 39B:
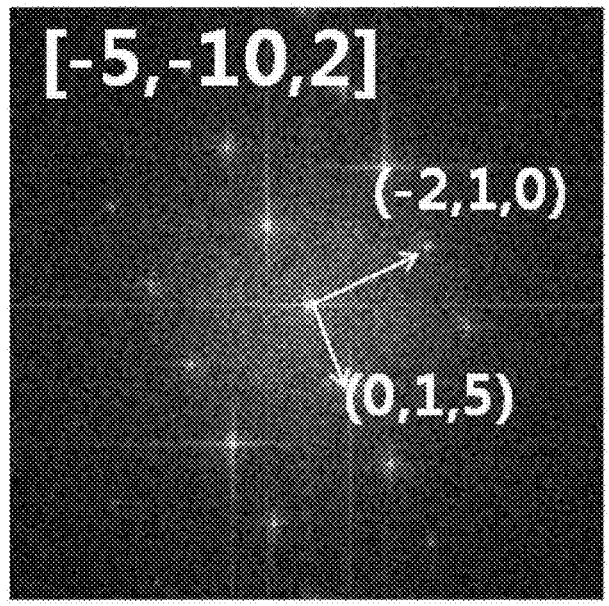
FIGS. 39B and 39C respectively show lattice diffraction patterns of FIG. 39A in Example 1.
Figure 39C:
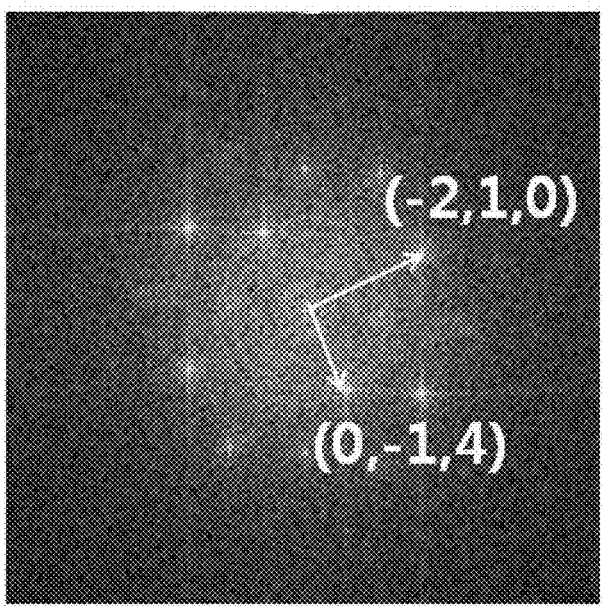

FIG. 39A shows a TEM image of thermoelectric materials prepared in Example 1, wherein a strain field is observed at the interface; and FIGS. 39B and 39C show lattice diffraction patterns of FIG. 39A prepared in Example 1. The (−2 1 0) face of two grains are in a coherent matching relationship, and the (0,1,5) face and the (0,−1,4) face are in a semicoherent matching relationship.

Example 2

1) Preparation of Mixed Powder (High Energy Milling)

High energy milling was used to uniformly disperse tellurium in $Bi_{0.5}Sb_{1.5}Te_3$, a thermoelectric matrix.

High energy milling was performed on $Bi_{0.5}Sb_{1.5}Te_3$ mixed with an excess amount of tellurium. The high energy milling was performed by mixing using a stainless steel ball and precursor materials, adding the mixture to a stainless steel container, filling the container with an inert gas, and then milling for more than a few hours.

The high energy milling produces a mixed powder of $Bi_{0.5}Sb_{1.5}Te_3$ and tellurium. The powders of $Bi_{0.5}Sb_{1.5}Te_3$ and tellurium are mixed during the high energy milling process and thereby form a high density of $Bi_{0.5}Sb_{1.5}Te_3/Te$ interfaces during the sintering process.

Then, the above mixed powder was subjected to a pressure-sintering using the spark plasma sintering of Example 1.

The structure of a pellet thus obtained from the pressure-sintering is similar to that of Example 1, and the structure and shape of the high density $Bi_{0.5}Sb_{1.5}Te_3/Te$ interface was similar, thus decreasing lattice thermal conductivity, but the density of $Bi_{0.5}Sb_{1.5}Te_3/Te$ interfaces is smaller than that of Example 1".

Comparative Example 1

Stoichiometric $Bi_{0.5}Sb_{1.5}Te_3$ not containing an excess amount of tellurium was subjected to pressure-sintering under the same conditions as in Example 1, thereby obtaining a thermoelectric material.

Comparative Example 2

Stoichiometric $Bi_{0.5}Sb_{1.5}Te_3$ not containing an excess amount of tellurium was subjected to melt-spinning under the same conditions as in Example 1 to prepare a ribbon, thereby obtaining a thermoelectric material.

Experimental Example 1

Measurement of Thermoelectric Performance

Figure 30:
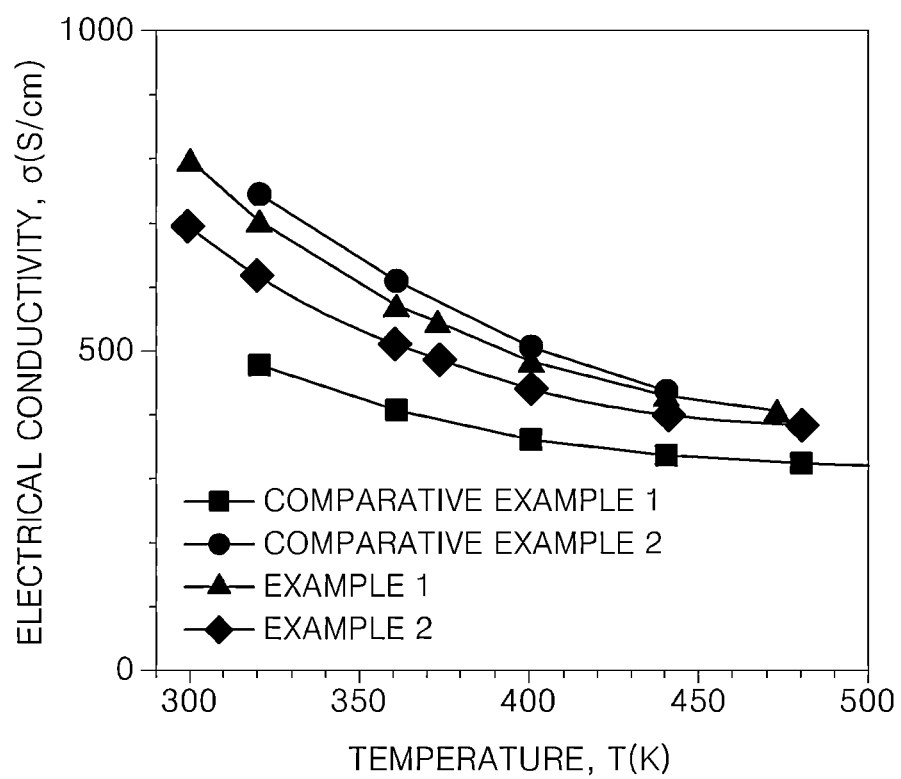
FIG. 30 is a graph of electrical conductivity (Siemens per centimeter, S/cm) versus temperature (Kelvin, K) which shows electrical conductivity of thermoelectric materials prepared in Example 1, Example 2, Comparative Example 1 and Comparative Example 2.
Figure 31:
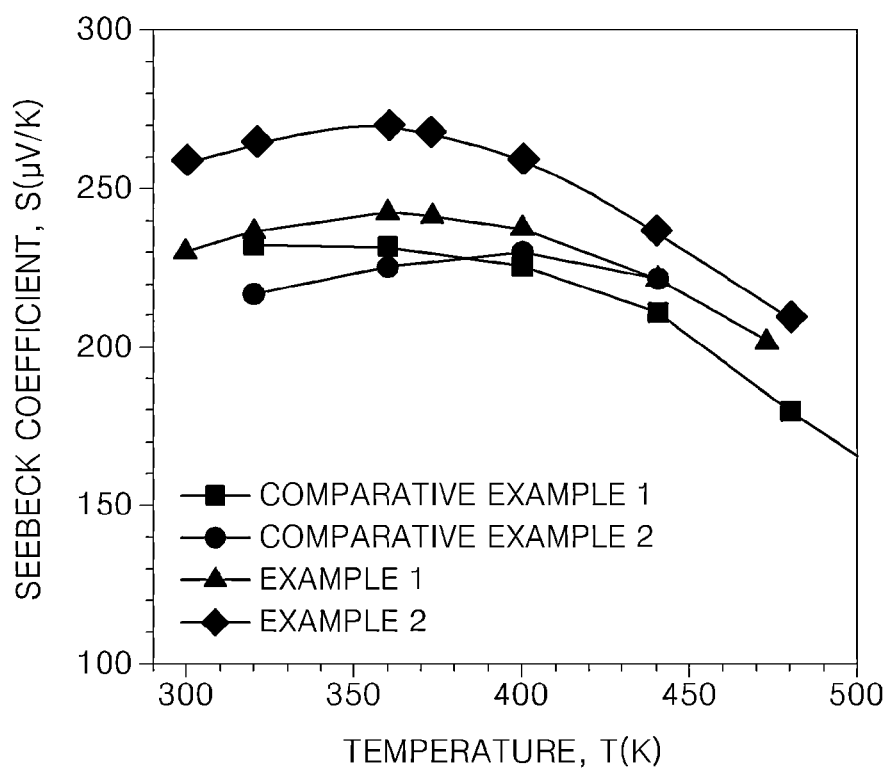
FIG. 31 is a graph of Seebeck coefficient (microvolts per Kelvin, μV/K) versus temperature (Kelvin, K), which shows the Seebeck coefficient of thermoelectric materials prepared in Example 1, Example 2, Comparative Example 1 and Comparative Example 2.
Figure 32:
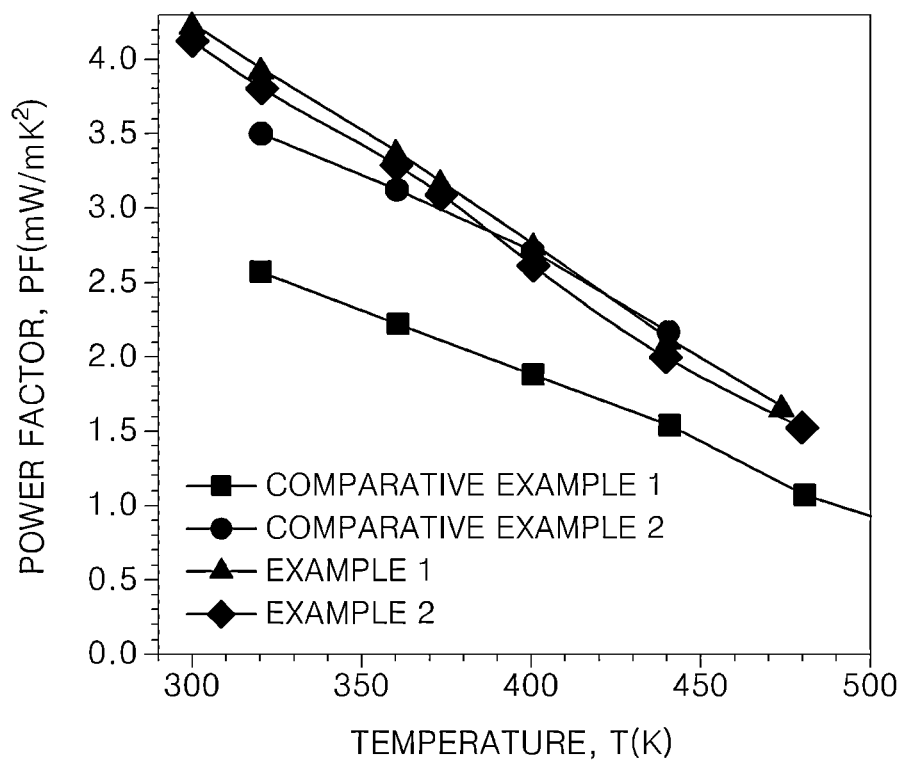
FIG. 32 is a graph of power factor (milliWatts per meter-square Kelvin, mW/mK$^2$) versus temperature (Kelvin, K), which shows the power factor of thermoelectric materials prepared in Example 1, Example 2, Comparative Example 1 and Comparative Example 2.

The thermal conductivity and Seebeck coefficient of the thermoelectric materials prepared by the above process in Example 1, Comparative Example 1 and Comparative Example 2 were simultaneously measured using a ULVAC ZEM-3 instrument, and the results are shown in FIGS. 30 and 31. Power factors calculated therefrom are shown in FIG. 32.

Figure 33:
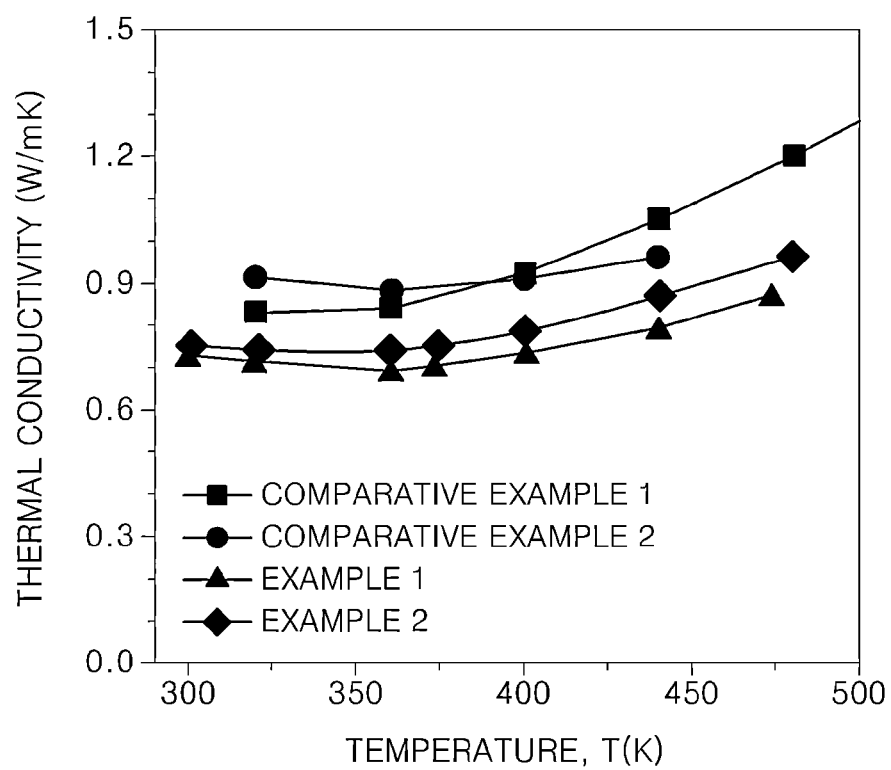
FIG. 33 is a graph of thermal conductivity (Watts per milliKelvin, W/mK) versus temperature (Kelvin, K), which shows thermal conductivity of thermoelectric materials prepared in Example 1, Example 2, Comparative Example 1 and Comparative Example 2.
Figure 34:
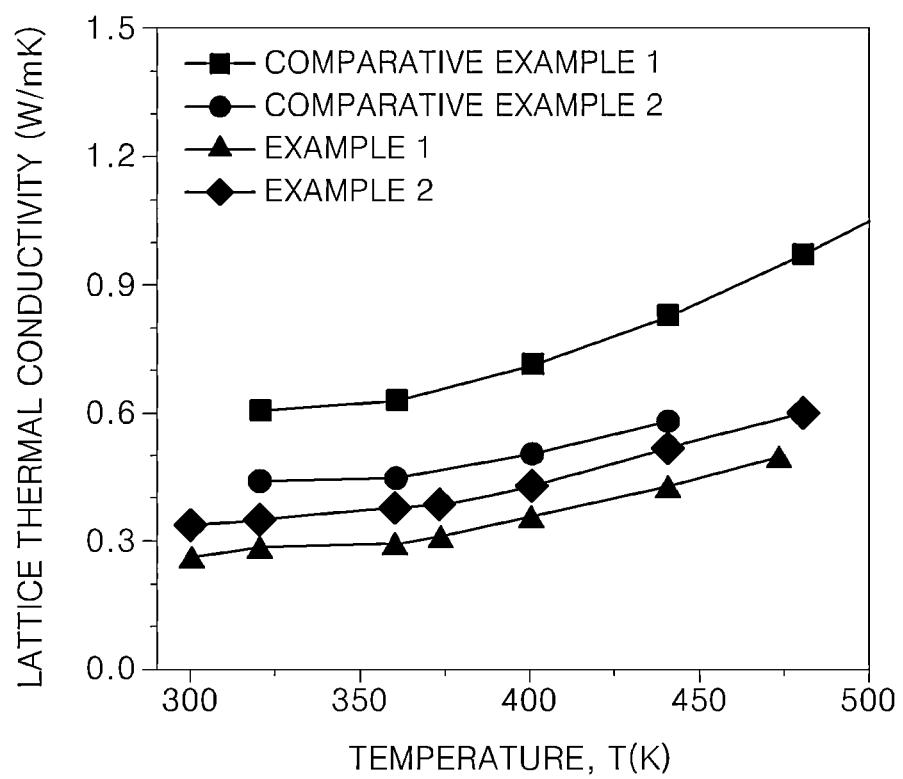
FIG. 34 is a graph of lattice thermal conductivity (Watts per milliKelvin, W/mK) versus temperature (Kelvin, K), which shows lattice thermal conductivity of thermoelectric materials prepared in Example 1, Example 2, Comparative Example 1 and Comparative Example 2.

Further, the thermal conductivity was calculated from the thermal diffusivity measured using a ULVAC TC-9000H instrument (Laser Flash method), and the results are shown in FIG. 33. The lattice thermal conductivity was calculated assuming that the Lorenz constant L is $L=2\times10^{-8}$ $WOhmK^{-2}$, and the result is shown in FIG. 34.

Figure 35:
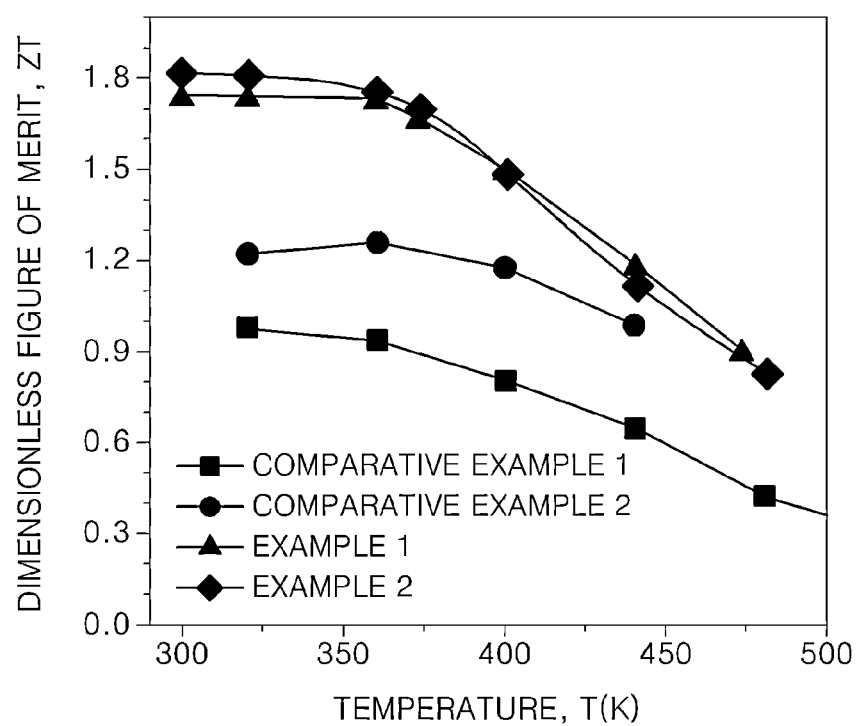
FIG. 35 is a graph of dimensionless figure of merit (ZT) versus temperature (Kelvin, K), which shows thermoelectric figure of merit of thermoelectric materials prepared in Example 1, Example 2, Comparative Example 1 and Comparative Example 2.
Figure 36A:
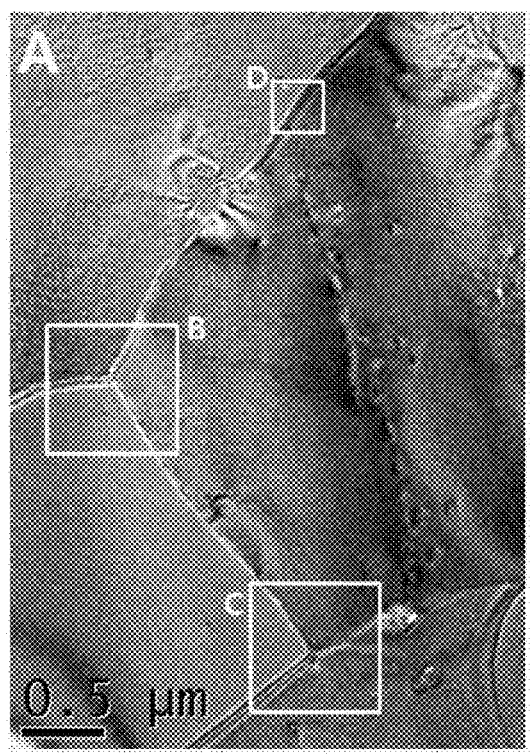
FIGS. 36A, 36B, 36C, and 36D show TEM images of thermoelectric materials prepared in Example 1, wherein the images are respectively at different magnifications and a high defect density is observed among grains of the materials at high magnifications.
Figure 36B:
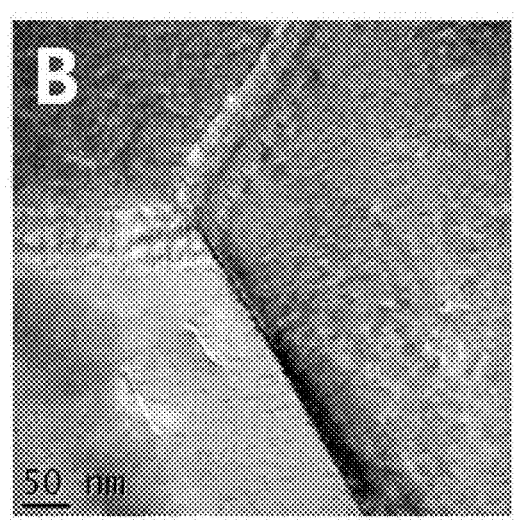
Figure 36C:
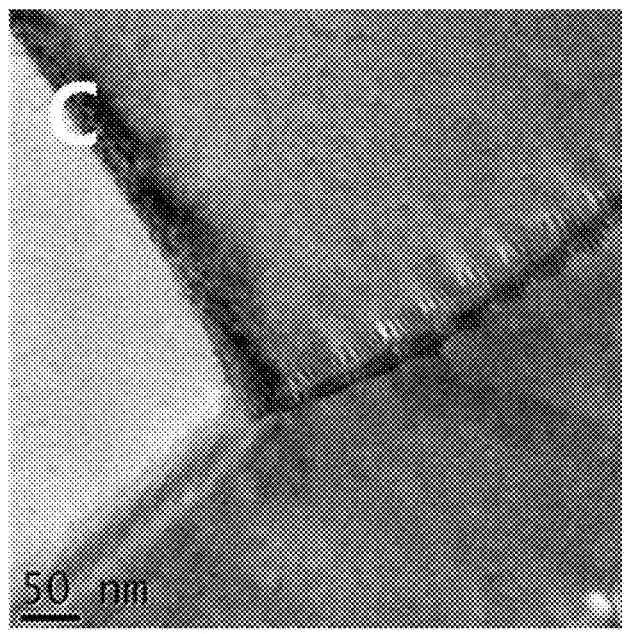
Figure 36D:
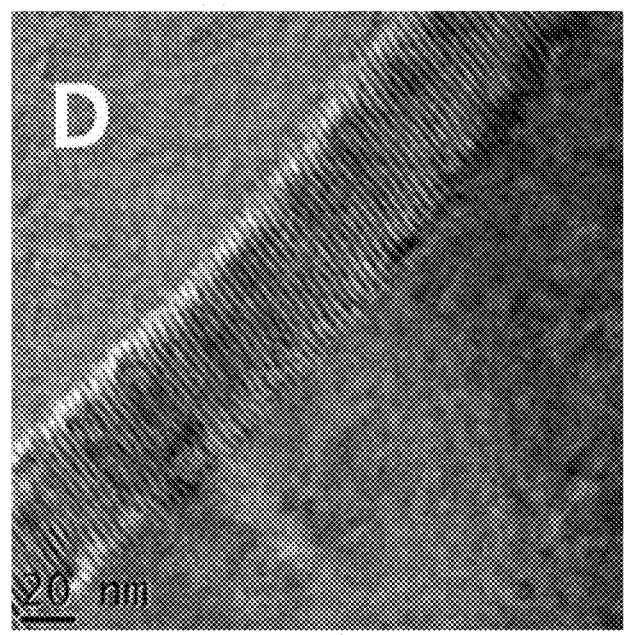

The thermoelectric figure of merit (ZT) calculated from the above result is shown in FIG. 35.

The thermal conductivity of Example 1 and Example 2 shown in FIG. 30 is similar to that of Comparative Example 2, in which only melt-spinning was performed. As compared to the $Bi_{0.5}Sb_{1.5}Te_3$ of Comparative Example 1 with respect to a comparative material, the increase in thermal conductivity appears to be due to the melt-spinning and high energy milling. The Seebeck coefficient of Example 1 shown in FIG. 31 shows an increase in comparison to that of Comparative Example 2, and this may be due to the Carrier Filtering effect at the $Bi_{0.5}Sb_{1.5}Te_3/Te$ interface. However, the effective increase is insignificant, and the power factor as shown in FIG. 32 is similar to that of Comparative Example 2. Therefore, the major reason for the increase in the power factor in comparison to Comparative Example 1 is certainly due to the melt-spinning.

FIG. 33 shows the thermal conductivity of Example 1, Example 2, Comparative Example 1 and Comparative Example 2. FIG. 33 shows that the thermal conductivity of both Example 1 and Example 2 significantly decreased.

FIG. 34 shows calculation results of the lattice thermal conductivity of Example 1, Comparative Example 1, and Comparative Example 2, assuming that the Lorenz constant is $L=2\times10^{-8}$ $WOhmK^{-2}$. Example 1 showed a very low value of 0.2-0.3 Watts per milliKelvin (W/mK) in comparison to 0.6 W/mK for Comparative Example 1 and 0.4 W/mK for Comparative Example 2.

Melt-spinning alone may lower the lattice thermal conductivity, however, it was confirmed in Example 1 that the presence of dislocations considerably reduced the lattice thermal conductivity. The observed dislocations and complex dislocations generated therefrom due to their correlation formed a strain field, thereby lowering lattice thermal conductivity. Accordingly, it was confirmed that the thermal conductivity was drastically lowered by producing a high density semi-coherent interface at high density by uniformly adding tellurium.

The reduction of lattice thermal conductivity of Example 2 was less than that of Example 1, in which the thermoelectric material was prepared by melt-spinning. High energy milling was used, a process that may easily be implemented on a large scale.

The thermoelectric figures of merit ZT of Example 1, Example 2 Comparative Example 1 and Comparative Example 2 calculated based on the above values are shown in FIG. 35. The ZT at room temperature was 1.7 or higher and the maximum ZT recorded was 1.74 at 87 K. This is a surprising improvement in performance at temperatures suitable for commercial use. Further, melt-spinning is a process capable of being implemented for large scale production, thus expanding its area of application and commercialization. In particular, by means of high energy milling, the ZT was 1.6 or greater, and the maximum ZT was 1.65 at 87 K. High energy milling is even more convenient than the melt-spinning process, and, with its capability of mass production, it can also contribute to reducing the cost of high performance thermoelectric materials.

The present disclosure provides a thermoelectric material with a much lowered thermal conductivity, wherein at least one of the crystal faces on the grain boundary included in the $(Bi,Sb)_2(Te,Se)_3$-based thermoelectric matrix forms a semi-coherent interface. The grain boundary in the thermoelectric matrix, for example, forms a semi-coherent interface, and this may include a high density of dislocations. Further, a semi-coherent interface may be formed between grains of the thermoelectric matrix and the metal additive having a lattice matching structure, and this may include a high density of dislocations.

The lattice thermal conductivity of the above thermoelectric material is very low, at about 0.4 W/mK or less, and, as a result, a considerably high thermoelectric performance is expressed. Further, ZT, the thermoelectric figure of merit indicating the thermoelectric performance, is very high at room temperature. In addition, because the thermoelectric material can be manufactured by a process that may be implemented easily on a large scale, it is possible to extend the area of its application and commercialization.

While an exemplary embodiment has been described in detail, the scope of the present disclosure is not limited to the foregoing embodiment, and it will be appreciated by those skilled in the art that various modifications and improvements including the concept defined in the appended claims are also included within the scope of the present disclosure.

What is claimed is:

1. A thermoelectric material comprising:
a thermoelectric matrix comprising grains with a composition of Formula 1:

$$(Bi_xSb_{1-x})_a(Te_ySe_{1-y})_b \quad \text{Formula 1}$$

wherein $1.8 \leq a \leq 2.2$, $2.8 \leq b \leq 3.2$, $0 \leq x \leq 1$, and $0 \leq y \leq 1$, and
wherein a plurality of dislocations is present along a grain boundary between adjacent grains of the composition of Formula 1, and
wherein the dislocations form an array spaced at an interval of about 1 nanometer to about 100 nanometers.

2. The thermoelectric material of claim 1, wherein the dislocations form an array spaced at an interval of about 1 nanometer to about 20 nanometers.

3. The thermoelectric material of claim 1, having a lattice thermal conductivity of about 0.4 Watts per meter-Kelvin or less at room temperature.

4. The thermoelectric material of claim 1, having a thermoelectric figure of merit of about 1.3 or higher at room temperature.

5. The thermoelectric material of claim 1, wherein the thermoelectric matrix further comprises an additive.

6. The thermoelectric material of claim 5, wherein the additive comprises tellurium.

7. A thermoelectric material comprising:
a thermoelectric matrix comprising grains having a composition of Formula 1:

$$(Bi_xSb_{1-x})_a(Te_ySe_{1-y})_b \quad \text{Formula 1}$$

wherein $1.8 \leq a \leq 2.2$, $2.8 \leq b \leq 3.2$, $0 \leq x \leq 1$, and $0 \leq y \leq 1$; and
an additive,
wherein a semi-coherent interface is present between a grain of the composition of Formula 1 and the additive, and
wherein the semi-coherent interface comprises a plurality of dislocations which form an array and are spaced at an interval of about 1 nanometer to about 100 nanometers.

8. The thermoelectric material of claim 7, wherein the dislocations form an array spaced at an interval of about 1 nanometer to about 20 nanometers.

9. The thermoelectric material of claim 7, wherein the additive is metal additive, and wherein a difference between a lattice constant of the metal additive and a lattice constant of the composition of Formula 1 of the grain is 15 percent or less.

10. The thermoelectric material of claim 7, wherein the additive comprises tellurium.

11. The thermoelectric material of claim 7, wherein the additive is a chalcogenide compound.

12. A method for manufacturing a thermoelectric material comprising:
heating a precursor material comprising a flux and a composition of Formula 1 to obtain a melt $$(Bi_xSb_{1-x})_a(Te_ySe_{1-y})_b, \quad \text{Formula 1}$$

wherein $1.8 \leq a \leq 2.2$, $2.8 \leq b \leq 3.2$, $0 \leq x \leq 1$, and $0 \leq y \leq 1$;
rapidly solidifying the melt to form a solidified intermediate; and
pressure-sintering the solidified intermediate to obtain the thermoelectric material,
wherein the thermoelectric material has a plurality of dislocations present along a grain boundary between adjacent grains of the composition of Formula 1.

13. The method of claim 12, wherein the flux is removed during pressure-sintering of the solidified intermediate.

14. The method of claim 12, wherein the flux is tellurium.

15. The method of claim 12, wherein the removing of the flux comprises a sintering process at a temperature higher than a melting point of the flux.

16. The method of claim 12, wherein the plurality of dislocations along a grain boundary between adjacent grains is formed during a rearranging of the grains in the thermoelectric matrix when the flux is melted by the pressure-sintering of the intermediate.

17. The method of claim 12, wherein the rapid solidification is melt spinning or gas atomization.

18. A method for manufacturing a thermoelectric material comprising:
heating a precursor material comprising an additive and a composition of Formula 1 to obtain a melt $$(Bi_xSb_{1-x})_a(Te_ySe_{1-y})_b, \quad \text{Formula 1}$$

wherein $1.8 \leq a \leq 2.2$, $2.8 \leq b \leq 3.2$, $0 \leq x \leq 1$, and $0 \leq y \leq 1$;
rapidly solidifying the melt to form a solidified intermediate; and pressure-sintering the solidified intermediate to form a thermoelectric matrix comprising grains with a composition of Formula 1 obtain the thermoelectric material,
wherein the thermoelectric material has a semi-coherent interface between a grain of the composition of Formula 1 and the additive.

19. The method of claim 18, wherein the additive is tellurium.

20. The method of claim 18, wherein an amount of the additive in the thermoelectric matrix is in excess of a stoichiometry of the tellurium in Formula 1.

21. The method of claim 18, wherein the additive is precipitated in the thermoelectric matrix via a eutectic reaction during the process of forming the intermediate.

22. The method of claim 18, wherein the rapid solidification is melt spinning or gas atomization.

* * * * *